United States Patent [19]

Vora

[11] Patent Number: 5,063,168

[45] Date of Patent: Nov. 5, 1991

[54] PROCESS FOR MAKING BIPOLAR TRANSISTOR WITH POLYSILICON STRINGER BASE CONTACT

[75] Inventor: Madhukar B. Vora, Los Gatos, Calif.

[73] Assignee: National Semiconductor Corporation, Santa Clara, Calif.

[21] Appl. No.: 493,071

[22] Filed: Mar. 13, 1990

Related U.S. Application Data

[60] Division of Ser. No. 248,300, Sep. 21, 1988, Pat. No. 4,974,046, which is a continuation of Ser. No. 881,155, Jul. 2, 1986, abandoned.

[51] Int. Cl.$^5$ .................. H01L 21/331; H01L 21/283
[52] U.S. Cl. ......................................... 437/31; 437/33; 437/162; 437/193; 437/186; 437/228; 437/200; 437/160; 148/DIG. 20
[58] Field of Search ................. 437/31, 32, 33, 164, 437/163, 162, 161, 228, 186, 187, 191, 193, 200; 148/DIG. 123, DIG. 20; 156/643, 657; 357/34

[56] References Cited

U.S. PATENT DOCUMENTS

| | | |
|---|---|---|
| 4,188,707 | 2/1980 | Asano et al. . |
| 4,209,350 | 6/1980 | Ho et al. ........................... 437/164 |
| 4,259,680 | 3/1981 | Lepseiter et al. . |
| 4,276,557 | 6/1981 | Levinstein et al. . |
| 4,305,200 | 12/1981 | Fu et al. . |
| 4,310,380 | 1/1982 | Flamm et al. ........................ 156/643 |
| 4,322,883 | 4/1982 | Abbas et al. ........................... 437/32 |
| 4,381,953 | 5/1983 | Ho et al. . |
| 4,398,962 | 8/1983 | Kanazawa . |
| 4,399,519 | 8/1983 | Masuda et al. . |
| 4,419,810 | 12/1983 | Riseman . |
| 4,453,306 | 6/1984 | Lynch et al. . |
| 4,478,679 | 10/1984 | Chang et al. . |
| 4,481,524 | 11/1984 | Tsujide . |
| 4,485,550 | 12/1984 | Koeneke et al. . |

(List continued on next page.)

FOREIGN PATENT DOCUMENTS

| | | |
|---|---|---|
| 1233571 | 3/1988 | Canada . |
| 0078501 | 5/1983 | European Pat. Off. . |
| 0101960 | 3/1984 | European Pat. Off. . |
| 0168324 | 1/1986 | European Pat. Off. . |
| 0248606 | 12/1987 | European Pat. Off. . |

OTHER PUBLICATIONS

Ghandhi, S., VLSI Fabrication Principles, John Wiley & Sons, 1983, pp. 420–437.

Primary Examiner—Brian E. Hearn
Assistant Examiner—T. N. Quach
Attorney, Agent, or Firm—Townsend and Townsend

[57] ABSTRACT

There is disclosed herein a process for making a base and emitter contact structure for a bipolar transistor which is comprised of a polysilicon stripe over an isolation island which stripe extends to a position external to the position of the isolation island and assumes the shape of an emitter contact pad. The emitter contact stripe has a layer of self aligned silicide formed thereover to lower its resistance, and this silicide is doped with both N and P type impurities one of which is selected to have a higher rate of diffusion than the other. A layer of self aligned insulating material is formed over the silicide and polysilicon of the emitter contact stripe. There are anisotropically etched insulating spacers formed on the sides of the emitter contact stripe, and there are silicide base contact stringers formed beside the spacers by anisotropic etching of a layer of doped silicide. A heat drive in step in the process used to make the structure, also disclosed herein, causes the impurities from the two silicide layers to diffuse into the emitter contact polysilicon and into the epitaxially grown silicon in the isolation island. An emitter and a base are and the the attendant base-emitter and base-collector junctions are formed because the faster diffusing impurity overtakes the slower diffusing impurity and passes it to thereby form the base region. The impurities from the base contact stringer also diffuse into the epitaxially grown silicone and their lateral diffusion causes them to link up with the base impurities which have diffused into the epitaxially grown silicon from the silicide over the emitter contact polysilicon.

14 Claims, 13 Drawing Sheets

U.S. PATENT DOCUMENTS

| | | | |
|---|---|---|---|
| 4,495,010 | 1/1985 | Kranzer . | |
| 4,507,171 | 3/1985 | Bhatia et al. . | |
| 4,508,579 | 4/1985 | Goth et al. | 156/657 |
| 4,521,952 | 6/1985 | Riseman . | |
| 4,536,945 | 8/1985 | Gray et al. . | |
| 4,609,568 | 9/1986 | Koh et al. . | |
| 4,636,834 | 1/1987 | Shepard . | |
| 4,641,170 | 2/1987 | Ogura et al. . | |
| 4,647,958 | 3/1987 | Gardner . | |
| 4,686,763 | 8/1987 | Thomas et al. | 437/51 |
| 4,691,436 | 9/1987 | Hirao | 437/33 |
| 4,764,480 | 8/1988 | Vora . | |
| 4,784,971 | 11/1988 | Chin et al. | 437/57 |
| 4,808,548 | 2/1989 | Thomas et al. | 437/57 |
| 4,818,720 | 4/1989 | Iwasaki | 437/58 |
| 4,824,796 | 4/1989 | Chin et al. | 437/57 |
| 4,871,684 | 10/1989 | Glang et al. | 437/31 |

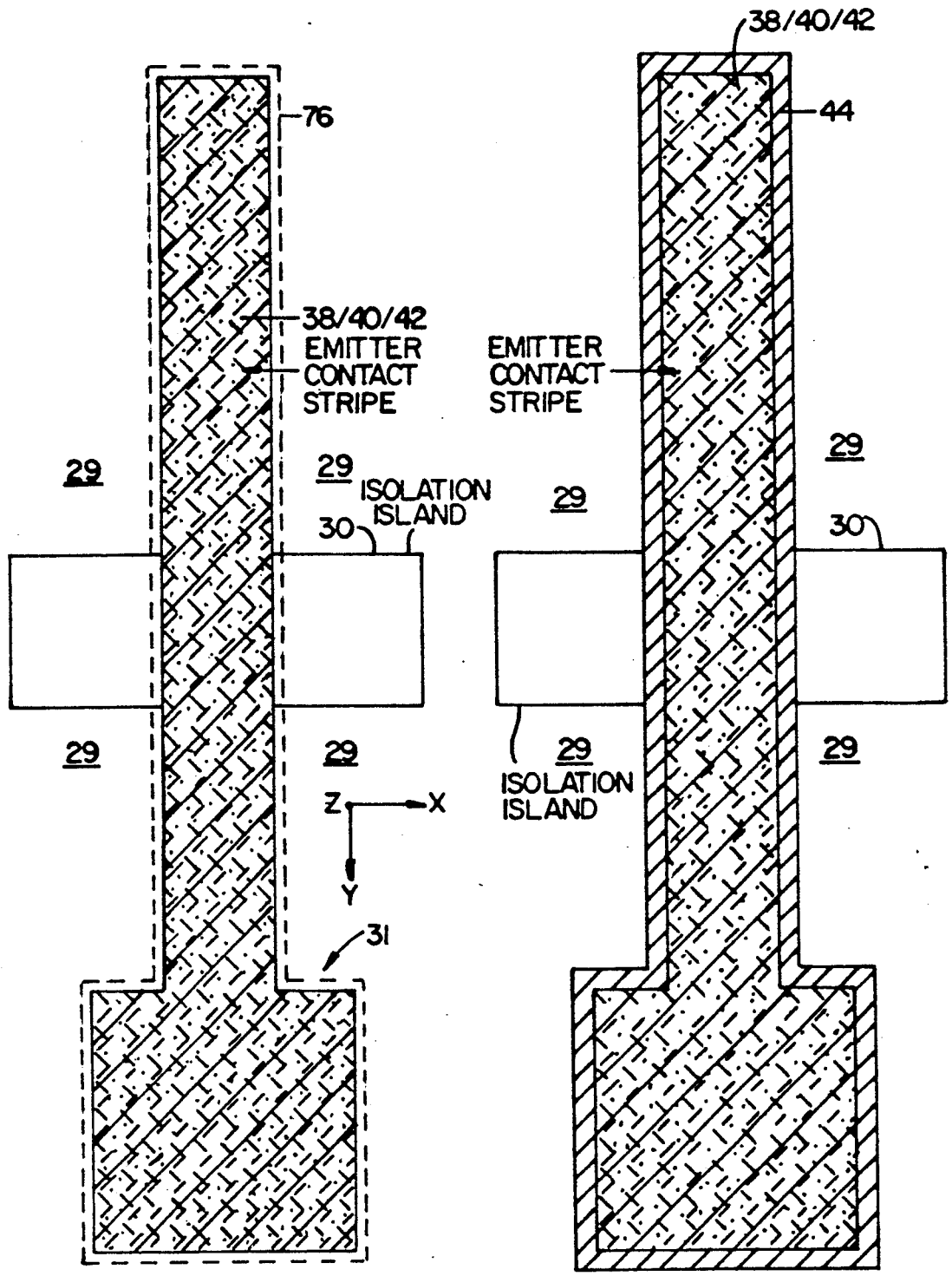

AREA OF BASE-COLLECTOR JUNCTION = $2\mu \times 1\mu$ = 2 MICRONS$^2$

EMITTER SIZE = $0.5\mu \times 1\mu$ = 0.5 MICRONS$^2$

COLLECTOR-BASE CAPACITANCE = 0.4 FEMPTOFARAD
EMITTER-BASE CAPACITANCE = 0.3 FEMPTOFARAD

PROCESS FOR MAKING BIPOLAR TRANSISTOR WITH POLYSILICON STRINGER BASE CONTACT

This is a divisional of application Ser. No. 07/248,300 filed Sept. 21, 1988, now U.S. Pat. No. 4,974,046, which is a continuation of Ser. No. 06/881,155 filed July 2, 1986, now abandoned.

BACKGROUND OF THE INVENTION

The invention pertains generally to the field of bipolar transistor construction, and more particularly, to a bipolar transistor of extremely small dimensions using a polysilicon stringer base contact.

The frequency response and switching speed of bipolar transistors is related to the amount of parasitic capacitance that results from the transistor structure. In a bipolar transistor there is a junction capacitance associated with the emitter-base junction and another junction capacitance associated with the base-collector junction. There are also other junction capacitances such as the collector-substrate capacitance which affect the operation of the transistor. Junction capacitance is directly proportional to the area of the junction. Therefore, the smaller the area of the junction, the smaller will be the capacitance. Further, in bipolar transistors there is a base resistance which is made up of two components. The first component is called the extrinsic base resistance, and is the resistance of the path through the base region from the center of the base contact to the edge of the emitter region. The second component of the base resistance is the resistance of the path through the base region from the edge of the emitter to the center of the emitter, i.e., in the portion of the base region directly underlying the emitter region.

It has long been known that if the size of the base region can be reduced, and the width of the emitter can be reduced, then beneficial effects will occur to improve the performance of the transistor. One of these effects is that the size of the emitter-base and base-collector junctions will be reduced. This reduces the parasitic capacitance affecting these junctions. Further, if the size of the base region is reduced, the extrinsic portion of the base resistance will also be reduced by virtue of a shorter path length. Also, if the size of the emitter can be reduced, the intrinsic portion of the base resistance will also be reduced by virtue of a shorter path length from the edge of the emitter to the center of the emitter through the base region. Since reduced path length reduces the total resistance, the dimensional changes in the size of the base and emitter will result in lower parasitic capacitance and lower parasitic resistance values. The result will be a higher high frequency cutoff and a lower switching speed.

Thus a need has arisen for a bipolar transistor with base and emitter regions which are reduced in size.

SUMMARY OF THE INVENTION

The invention fills the need for a bipolar transistor having a reduced size base region and reduced emitter region width thereby resulting in very high performance. The invention, in one important aspect, is a bipolar transistor structure having a silicide covered polysilicon emitter contact stripe over an emitter region in a substrate and silicide stringer base contacts. The silicide base contact stringers are formed on the sides of the emitter contact stripe normal to the surface of the substrate, but are insulated therefrom by silicon dioxide spacers in the form of anisotropically etched stringers. The silicide base contact stringers lead to a base contact window or post type via located on a contact pad outside the perimeter of the isolation island and leading to an overlying metal layer with which the stringer base contacts may be in contact. The base contact pad is silicide, and is located outside the perimeter of the base region isolation island. The silicide stringer base contacts form extensions of the silicide of the base contact pad.

A silicide layer is formed on top of the polysilicon stripe by depositing a layer of refractory metal covering the entire layer of polysilicon covering the entire surface of the die prior to the etching of the polysilicon to define the emitter stripe. The die is then subjected to a heat pulse treatment in a known fashion thereby causing the refractory metal to form silicide everywhere it is in contact with polysilicon.

The emitter contact is a stripe of polysilicon having a width equal to the minimum photolithographically obtainable distance, D. In some embodiments, the emitter contact stripe is more narrow than the minimum distance D and is formed by overetching the polysilicon stripe using a mask which has a width of D. The silicide covering the polysilicon emitter stripe is self aligned by virtue of its having been formed prior to the etching of the polysilicon to form the emitter stripe. The emitter stripe leads to a emitter contact pad located outside the perimeter of the base contact isolation island. Both the base and emitter contact pads have dimensions which are large enough to contain within their perimeters a contact window or post type via which has a dimension equal to D on all sides plus the area consumed by the alignment margins on all sides of the window or via perimeter. Such an alignment "cushion" area is necessary to prevent loss of yield from alignment errors during fabrication. In alternative embodiments, the polysilicon of the emitter stripe can be extended to another place in the circuit to make contact with another node in the circuit, or it can extend over another isolation island to form the emitter of another transistor which shares an emitter with the original transistor from which the polysilicon emitter stripe originated. The same thing may be done with the silicide of the base contact pad. These two layers therefore provide a "free" interconnection layer under the first metal or polysilicon interconnection layer.

The emitter contact stripe is separated from the silicide base contact stringer by an insulating shoulder or spacer made of silicon dioxide. In other embodiments, other insulating materials may be used which are electrically and thermally compatible with the electrical functioning of the transistor and its structural integrity. This insulating shoulder is very narrow by virtue of the process used to make it. The process used to make this insulating shoulder involves depositing a layer of CVD oxide over a thin layer of thermally grown oxide such that the composite layer has the desired thickness of the shoulder. This oxide layer blankets the entire wafer area. Since the oxide layer bulges at the location of the emitter stripe like a blanket of snow would bulge if it fell on a two by four piece of lumber lying on a flat surface, an anisotropic etch step may be used advantageously to form the oxide shoulders. The anisotropic etch is continued long enough to remove all the oxide over horizontal surfaces, i.e., surfaces parallel to the surface of the substrate, leaving only oxide adjacent to vertical surfaces, i.e., surfaces normal to the substrate surface.

This causes the formation of an oxide stringer along the edges of the emitter stripe which completely insulate the surface of the poly emitter stripe which is normal to the surface of the substrate. These oxide stringers are self aligned with the edges of the poly emitter stripe at the intersection of the covered edges and the "top" surface, i.e., the surface parallel to the surface of the substrate. This insulating material stringer is the insulating spacer or shoulder which will separate the emitter stripe from the base contact stringers. This insulating shoulder has the width of the original oxide layer's deposit depth.

The silicide base contact stringer is formed in the same manner as was the insulating shoulder. After the emitter polysilicon stripe is deposited and etched and after the oxide insulating shoulder is formed, a layer of silicide is formed by any conventional manner over the entire wafer surface. This silicide is doped to the proper polarity to form a base contact. The silicide forms a blanket which covers the entire wafer with bulges at the locations of all the emitter stripes and oxide shoulders. An anisotropic plasma etch is then used to remove all the silicide lying over surfaces parallel to the surface of the substrate thereby leaving silicide stringers formed on the surfaces normal to the surface of the substrate. This forms a silicide base contact over the base region isolation island adjacent to the oxide shoulder and insulated from the emitter contact stripe by the oxide shoulder.

The process for making the bipolar transistor structure of the invention involves first manufacturing an isolation island by any known method at every location in the substrate where a transistor is to be formed. Isolation islands are formed for each transistor, with electrically isolated portions of the epitaxial layer in each island being employed for base-emitter area and collector contact to an underlying buried layer. Any method of forming these isolation islands can be utilized, but the Fairchild Isoplanar TM method is preferred. The surface of the isolation island is preferably planarized using known techniques to remove the "birds heads". Preferably an N+ buried layer in a P− substrate is formed at all isolation island locations where NPN transistors are to be formed. A P− type epitaxial silicon is formed over this buried layer to serve as the base region.

Next a layer of polysilicon is deposited over the entire wafer surface. Then a layer of silicide is formed over the entire polysilicon layer, and this silicide is doped with both N and P type impurities to N+ and P− concentrations respectively. Following silicide formation, a layer of insulating material, preferably silicon dioxide deposited by chemical vapor deposition (hereafter CVD oxide) is deposited over the entire silicide surface. The combined three layers are then etched in a known manner to define the emitter contact stripe and the emitter contact pad.

In some embodiments, the emitter contact poly is overetched such that the photoresistant nitride overhangs the edges of the poly. Preferably the photoresist is developed such that the width of the emitter contact stripe is the minimum photolithographically obtainable distance, D. In overetched embodiments then the emitter contact stripe may be as narrow as one half the minimum photolithographically obtainable distance, D.

Next the photoresist is dissolved, and a layer of thermal oxide is grown so as to cover all exposed silicon surfaces including the sides but not the top of the polysilicon emitter stripe and the exposed portions of the top surface of the P− epi.

To form the insulating shoulders, a layer of CVD oxide is deposited over the entire wafer. The CVD oxide is deposited to the approximate thickness desired for the oxide shoulders to be formed less the thickness of the thermal oxide already formed. Then an anisotropic etch step is performed as described above to form the oxide shoulder completely surrounding the emitter contact stripe.

The base contact stringers and base contact pad are next formed. The first step in this process is forming a blanket layer of silicide, and doping it P+ for NPN transistors. Next an etch mask is formed over a portion of the doped silicide overlying the end of the emitter contact stripe at the opposite end from the emitter contact pad. Finally, an anisotropic etch is performed to form the silicide base contact stringers.

After forming the base contact stringer, it is preferable to remove the portion of the stringer which surrounds the emitter contact pad located outside the isolation island for the base region since this allows the emitter contact poly to be extended to other nodes as an interconnection line. To do this, an emitter stringer removal etch mask is formed by depositing, exposing and developing photoresist such that it covers the base region isolation island, the end of the emitter contact stripe upon which the base contact pad will be formed and all portions of the emitter contact poly stripe other than the emitter contact pad and a portion of the emitter contact stripe which connects to the emitter contact pad. A selective etch is then performed to etch away all exposed silicide but not any exposed CVD oxide or other insulation material thereby removing the base contact stringers from around the perimeter of the emitter contact pad.

Next, the emitter stringer removal etch mask is removed. This leaves the base contact stringer and the polysilicon emitter stripe and the emitter contact pad exposed.

Next a heat drive-in step is performed to drive impurities into the substrate from the silicide to form the emitter contact, the emitter region and the base contact region in the substrate. The entire structure is heated to approximately 800 to 1000 degrees centigrade for approximately 30 minutes. This causes the N and P type impurities in the silicide overlying the emitter contact stripe to outdiffuse into and through the emitter contact stripe polysilicon. The P type impurities outrun the N type impurities, and diffuse into the substrate through the emitter contact stripe to form a base region. The N impurities diffuse into and through the emitter contact stripe and into the substrate to form an emitter region. The P impurities in the silicide base contact stringers diffuse into the underlying substrate and form base contact regions of P+ concentration which join the P concentration base region just formed.

This leaves the transistor structure complete except for the formation of contacts to the emitter and base contact pads.

Preferably contacts to the transistor are made through post type vias through an overlying layer of silicon dioxide or other compatible insulating material. However, in other embodiments standard contact windows formed in overlying passivation layers may also be used. In the preferred embodiment, the post type vias are formed by depositing a thick layer of photoresist over the entire structure. The photoresist is then exposed to radiation everywhere except where the post vias are to be formed. One via is located on the emitter contact pad, and the other via is located on the base stringer contact. The unexposed photoresist is then dipped off to leave a hole in the thick photoresist pattern at the location of each post. The metal of the post is then deposited in a blanket over the entire surface of the wafer. This metal goes down into the holes in the photoresist, and also covers the top surface of the photoresist. However, because of the thickness of the photoresist, the step coverage at the edges of the holes will be incomplete. The photoresist is then removed, and this will leave the posts standing at the desired locations. Because the step coverage at the edges of the holes in the photoresist is very bad, removal of the photoresist will also remove all the metal on top of the photoresist without effecting the metal of the posts in the holes. This technique is called the lift-off technique. However, other techniques are known for forming posts, and any one of these techniques will work for purposes of practicing the invention.

After forming the posts, a passivation layer of insulating material is formed. This is done by depositing a thick layer of CVD oxide to a height greater than that of the posts. Then, this oxide is etched back until the tops of the posts are exposed. This forms a planarized layer of oxide with the tips of the posts exposed just above the planar surface. A metal conductive layer can then be formed by conventional means to make contact with the tops of the posts and thereby to make contact with a transistor. Thereafter, another insulation layer may be formed over the entire structure to passivate the circuit.

BRIEF DESCRIPTION OF THE DRAWINGS

FIG. 8 is plan view of the structure after the emitter contact stripe has been formed.

FIG. 9 is a plan view of the structure after the insulating spacer has been formed.

FIG. 15 is a plan view of the base-emitter contact structure of the invention illustrating it typical dimensions and giving certain performance related characteristics.

DETAILED DESCRIPTION OF THE PREFERRED EMBODIMENT

Figure 1:
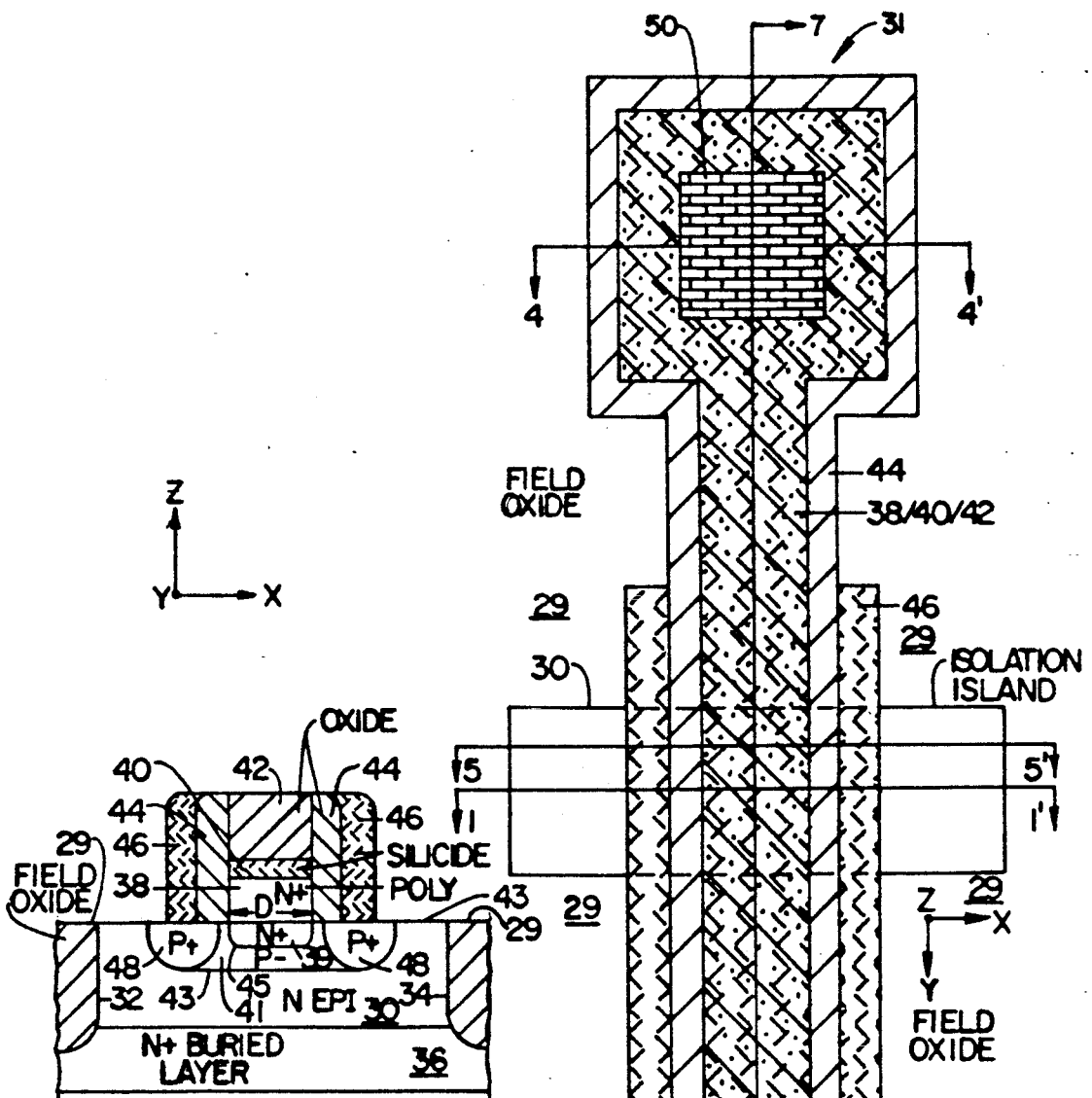
FIG. 1 is a cross-sectional view of the transistor structure taken through the isolation island along the section line 1—1' in FIG. 2.
Figure 2:
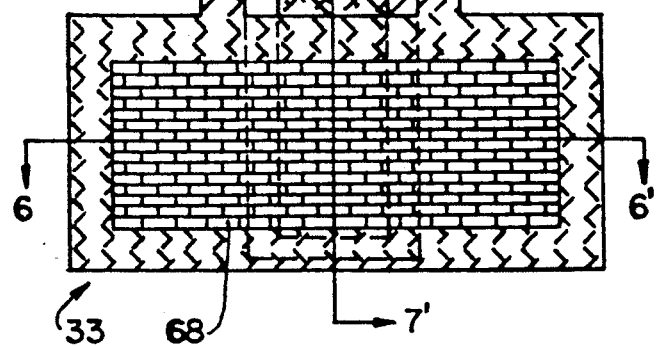
FIG. 2 is a plan view of the finished transistor structure.

Referring to FIG. 1, there is shown a cross-sectional view through the isolation island of the base and emitter contact structure for the transistor of the invention. The section of FIG. 1 is taken along the section line 1—1' in FIG. 2. FIG. 2 is a top view of the base and emitter contact structure for the transistor of the invention showing the locations of the contact pads for the base and emitter at positions external to the perimeter of the isolation island. The sectional view of FIG. 1 shows only the base and emitter contact structure and the base and emitter regions in the substrate of the transistor of the invention. The collector structure can be any conventional structure, and those skilled in the art will appreciate how any of these conventional collector and collector contact structures can be connected to the base and emitter structure of the invention.

The invention will be described in terms of an NPN transistor; however, those skilled in the art will appreciate the changes which must be made in the doping to make a PNP transistor. In FIG. 1 an isolated island of N type, epitaxially grown silicon 30 (hereafter epi) is defined by a field of oxide 29 of which the edges which define the isolation island are shown at 32 and 34. A buried layer 36 is shown under the epi 30. Its presence is preferred, because it lowers the series collector resistance. However, it may be omitted without rendering the transistor inoperative, and it will not be shown in subsequent drawings describing the preferred process of the invention for making the transistor of the invention.

An N+ doped polysilicon (hereafter poly) emitter contact 38 is formed atop the epi 30. This poly emitter contact has the shape shown in FIG. 2, and extends over the isolation island and out over the field oxide 29 in the positive and negative y directions (in accordance with the coordinate system shown in FIGS. 1 and 2; the origin is arbitrarily selected and may vary from drawing to drawing) to the locations of an emitter contact pad 31 and a base contact pad 33 located outside the perimeter of the isolation island. The purpose of this poly layer 38 is to provide a conductor to make contact with an emitter region 39 in the epi layer 30. This emitter region serves as a source of current carriers which are injected into a base region 41 to enable transistor action to occur. The manner in which the emitter region 39 and the base regions 41 are formed will be described in more detail below. In the preferred embodiment, the emitter region of N+ doped epi extends approximately 500 Å below the substrate surface 43.

In the preferred embodiment, the width of the poly emitter contact 38 in the x direction is the minimum achievable dimension, D, which can be obtained using the process used to manufacture the transistor. In optical photolithography in 1986, D is approximately 1 micron in many fabrication facilities. With further improvements in photolithography such as use of X rays as the radiation source, or through use of direct write electron beam systems, Ds smaller than 1 micron are or will become possible. Further, through use of controlled overetch processing, D may be reduced to approximately 0.6 microns.

It is preferable to make D as small as possible so as to minimize the area of the base-emitter junction. Minimizing the area of the base-emitter junction by keeping D small minimizes the parasitic capacitance of the base-emitter junction. This improves the performance of the device by lowering the Miller effect input capacitance by decreasing the switching speed of the device and by increasing the high frequency cutoff of the transistor.

The poly emitter contact 38 is preferably 3000 Å thick, but this dimension is not critical to the invention. The poly emitter stripe 38 is completely covered on its top surface with a self-aligned layer of silicide 40. This layer of silicide 40 is self-aligned with the edges of the poly emitter contact stripe 38 along both the x and y axes. That is, the poly contact stripe 38 has edges which are parallel to the z axis and which define the extents of the poly contact stripe 38 along the x and y axes. The edges of the silicide 40 define planes parallel to the y-z plane which are coincident with the planes defined by the edges of the poly contact stripe 38. The silicide layer 40 lowers the sheet resistance of the poly contact stripe 38, and its presence is preferred but not essential.

A layer of insulating material 42 is formed atop the silicide layer 40 and the poly emitter contact stripe 38. This insulating material is self-aligned with the edges of the poly 38 and the edges of the silicide 40. The term self-aligned, as it is used in conjunction with the description of the structure of the layer of insulating material 42, has the same meaning as defined above for use of the term in conjunction with the description of the silicide layer 40. The manner in which the planes defined by the edges of the insulating layer 42, the silicide layer 40, and the poly 38 become coincident will become clear in the discussion below of the preferred manner in which the structure shown in FIG. 1 is formed. In the preferred embodiment, the insulating layer 42 is comprised of silicon dioxide formed by chemical vapor deposition or low pressure chemical vapor deposition (hereafter CVD oxide). In the preferred embodiment, the insulating layer 42 is approximately 5000 Å thick. The purpose of the insulating layer 42 is to insulate the top of the emitter contact 38 and its overlying silicide layer 40 (where used) such that a base contact pad may be subsequently formed over one end of the emitter contact without shorting the base and emitter contacts together.

The edges of the poly emitter contact 38 and the silicide layer 40 (in embodiments in which this layer 40 is used) must be insulated to prevent shorts to the base contact stringers to be described below or to other structures. To perform this function, an insulating spacer 44 is formed around the edges of the poly emitter contact 38, the silicide layer 40, and the overlying insulating layer 42. This spacer extends completely around the poly emitter contact 38 as is best seen in FIG. 2. The thickness is a matter of choice as will be understood from the description given below as to how the spacer is made. In the preferred embodiment, the insulating spacer 44 is comprised of two layers of oxide. The layer closest to the poly emitter contact 38 is a thin layer of thermal oxide, and the layer farthest from the poly emitter contact is CVD oxide. Preferably, the spacer 44 is as narrow in the x direction as possible without loss of its integrity as an insulator so as to minimize the area of the substrate and base regions which the spacer "shadows". By minimizing the area of the cross-section of the spacer in the x-y plane, the area of the base-collector junction may be minimized. Those skilled in the art will appreciate that smaller base-collector junction areas lead to smaller parasitic junction capacitances afflicting the junction which improves the performance of the device in allowing faster switching speeds.

A base contact to the base area 41 is needed to complete the base and emitter contact structure of the invention. To further minimize the area of the base-collector junction 43, the invention uses a stringer base contact 46. In the preferred embodiment, the stringer base contact 46 is formed of silicide which is deposited or formed in any conventional manner. The stringer base contact extends in the z direction to the top of the insulating spacer 44, which itself extends to the top of the insulating layer 42. This geometric configuration of the insulating layer 42 is to prevent any "crawl-out" of poly in the emitter contact 38 to form silicide which might short the emitter contact 38 to the base contact stringer 46 and to prevent the silicide layer 40 from accidentally shorting the emitter contact 38 to the base contact 46.

The thickness of the stringer base contact 46 is very small, and can be controlled by controlling the thickness of the layer of silicide formed prior to the etch step which forms the stringer, as will be seen from the description of the process given below. This allows the dimension of the base contact stringer along the x axis to be kept at a minimum which is much less than D, thereby allowing the designer to further minimize the area of the base-collector junction.

To complete the base contact, a P+ doped region 48 in the epi layer 30 is formed directly below the base contact stringer 46. The manner of formation of this region 48 will be described further below. The P+ doped region 48 extends laterally away in the positive and negative x directions from the edges of the stringer base contact 46, and joins and thereby makes electrical contact with the base region 41 to complete the base contact structure. A final layer of CVD oxide (not shown) is formed over the entire structure to passivate it. This layer protects the base and emitter contacts from shorts with overlying metal layers and seals the structure from the ambient atmosphere.

FIG. 2 shows a top view of the completed emitter and base contact structure of the invention. Identical reference numerals identify the same structures in FIGS. 1 and 2. Note that the base contact stringer 46 does not extend the full length of the emitter contact stripe 38. Instead, the base contact stringer 46 extends from the base contact pad 33, over the isolation island 30 and out over the field oxide on the side of the isolation island opposite from the base contact pad 33. However, the base contact stringer 46 stops short of the emitter contact pad 31. The reasons for this is twofold. First, the elimination of the base contact stringer around the emitter contact pad 31 prevents a base-emitter short in case of a misalignment of a contact hole or post type via such as post type via 50 on the emitter contact pad used to make contact with the emitter contact structure. For example, if the post via 50 were misaligned, such that a portion of its area overlapped the perimeter of the emitter contact pad 50, the metal of the post via 50 would contact both the emitter contact stripe and the base contact stringer, thereby creating a base-emitter short which would render the transistor inoperative. This cannot happen when the stringer is removed from around the emitter contact pad 31.

Another reason to remove the stringer from around the emitter contact pad 31 is to simplify the connection of the emitter of one transistor to the emitter of another transistor. It is very common in integrated circuit structures to have two transistors share a common emitter region and its associated emitter contact structure.

Figure 3:
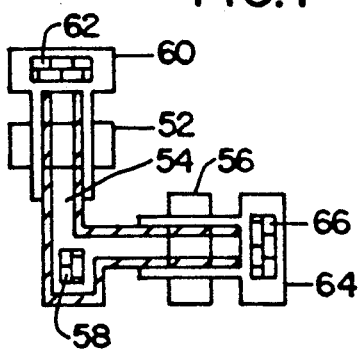
FIG. 3 is a plan view of two transistors of the structure of the invention and having a shared emitter.

FIG. 3 shows such a situation. There, a first transistor having isolation island 52 shares a common emitter contact structure 54 with a second transistor having an isolation island 56. A contact window 58 or post type via serves as a connection point for other nodes in the circuit or to the outside world. The first transistor has a base contact pad 60 and a contact window 62 to connect the base of transistor one to other nodes in the circuit or to an external pin. The second transistor has a base contact pad 64 for a contact window 66 or post type via for connection of the second transistor base to other nodes in the circuit. Note how the absence of a base contact stringer 46 around the emitter contact stripe 54 simplifies the interconnection of the two transistors since the poly of the emitter contact for the first transistor may simply be extended over the isolation island 56 of the second transistor to form the emitter contact and emitter region for the second transistor. If a base contact stringer were present completely surrounding the emitter contact stripe, two separate emitter contact stripes, one for each island, would be required. The interconnection of the two emitters would require two emitter contact holes such as the contact hole 50 in FIG. 2 with a metal interconnection pattern etched in a layer of metal overlying the CVD oxide passivation layer to interconnect the two emitters. Such a structure would consume more chip area because of the area consumed by the extra contact hole and would tend to cause more yield reducing defects caused by bad metal interconnection, e.g., gaps in the metal, or misalignment errors.

However, in some embodiments, the base contact stringer 46 may be left surrounding the emitter contact stripe, and the base and emitter contact structure of the invention will be operative.

The extension of the emitter contact stripe outside the perimeter of the isolation island 30 in FIG. 2 allows the isolation island to be smaller and allows the base-emitter and base-collector junction areas to be smaller. The reason for this is that if a contact window to the emitter must be formed within the perimeter of the isolation island, the emitter stripe 38 must be large enough to encompass a contact window plus surrounding alignment cushions.

These alignment cushions are sometimes referred to as "nesting tolerance" and refers to a design rule tolerance used where a feature on a particular level of an integrated circuit must be nested within a feature on another level of an integrated circuit. The nesting tolerance is necessary because of several uncertainties in the manufacturing process. These include the uncertainty of the exact location of the edge of the feature on the first level and the uncertainty of the exact location of the edge of the feature on the second level and the uncertainty of the overlay alignment exactness. The size of mask features can vary from chip to chip on the mask because of improper exposure, and other factors. An absolute size variation of + or −0.2 micrometers across a 125 millimeter square mask is not uncommon. When these variable size mask features are lithographically transferred to a wafer, more deviation from the original layout occurs. The resist image can vary from the mask image because of variations in any or all of the lithographic processing variables, such as resist thickness, baking temperature, exposure, and development conditions. The etching process which transfers the resist image into the polysilicon or other material can also vary the etched image size from wafer to wafer and from day to day because of variations in the isotropy of the etch process. An absolute variation of the final etched image of + or −0.4 micrometers over a year of production is easily possible.

An emitter which required an area over the isolation island which was large enough to nest a contact window plus the area consumed by the nesting tolerance would be substantially larger in area than the emitter stripe 38 of the structure of FIG. 2. This is because the smallest contact window which can be made has a dimension D on each side. To allow for alignment errors, an alignment error cushion must be left on all sides of the contact window. The resultant minimum emitter contact dimension on one side is D plus the alignment cushion, C. The result is a minimum emitter contact area of $(D+C)^2 = D^2 + 2DC + C^2$. This results in a larger emitter-base junction area because the emitter region 39 in FIG. 1 is formed by outdiffusion of impurities from the emitter contact poly. Thus the emitter-base junction area is defined by the area of the emitter contact. By putting the emitter contact window outside the perimeter of the isolation island, the emitter contact 38 may be made with a dimension of one D or less on a side, thereby minimizing the emitter-base junction area and the parasitic capacitances which exist at this junction.

The same logic as given above for the minimization of the emitter-base junction area applies equally to the minimization of the base contact size and the base-collector junction area. That is, if the base contact over the isolation island had to be large enough to encompass a base contact window, the base contact area over the isolation island would be much larger than the area under the base contact stringer 46 of the invention. Since the base-collector junction area generally encompasses the total area "shadowed" by the emitter contact, i.e., over which the emitter contact lies, plus the area shadowed by the base contact plus any insulating spacers between these two contacts, it is of paramount importance to minimize all these areas to minimize the base-collector junction area and the associated junction parasitic capacitance. The total shadowed area is minimized by use of a base contact stringer 46 and an insulating spacer 44 which is formed in the same manner. These stringers can be made much smaller than the minimum line width D which can be obtained with the photolithography process. By extending the base contact stringer 46 to the location of the base contact pad 33, and by expanding the base contact stringer to form a base contact pad which is large enough to encompass a contact window such as the window 68 plus an alignment cushion, a smaller base-collector junction area can be obtained with no loss in yield. This can be done without the complications of trying to make a very small contact window and align it over a very small base contact pad located within the perimeter isolation island. With the structure of the invention, ample sized contact windows may be easily aligned over contact pads which are sized to have adequate alignment error cushions to make alignment easy.

PROCESS SEQUENCE

Figure 4A:
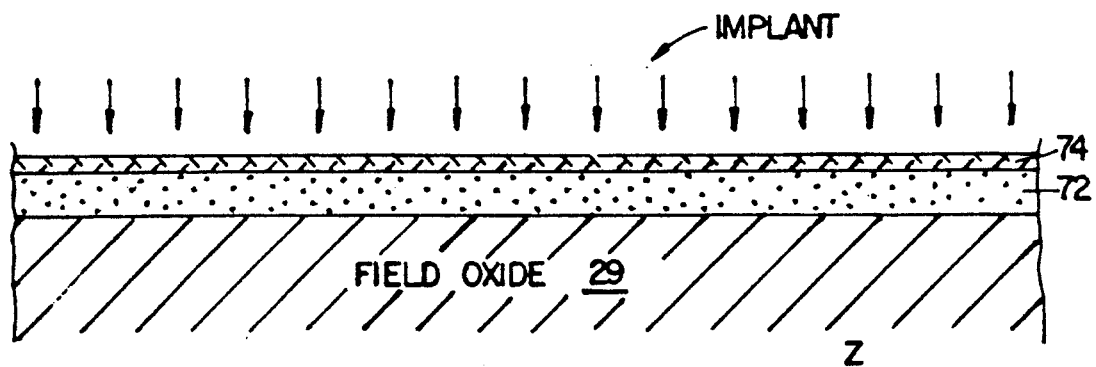
FIGS. 4A-4E are cross-sectional views of the transistor of the invention taken along section line 4—4' in FIG. 2 through the emitter contact pad at various stages in the process.
Figure 4B:
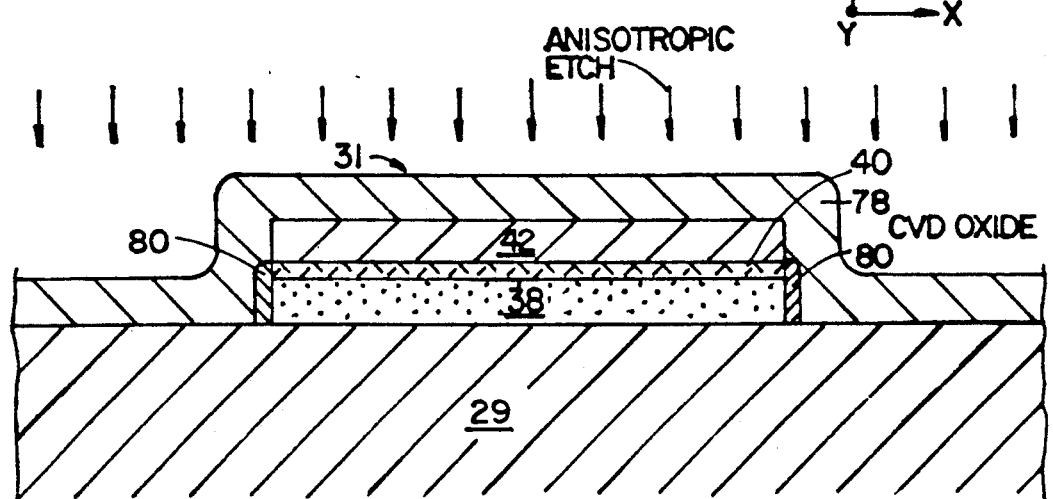
Figure 4C:
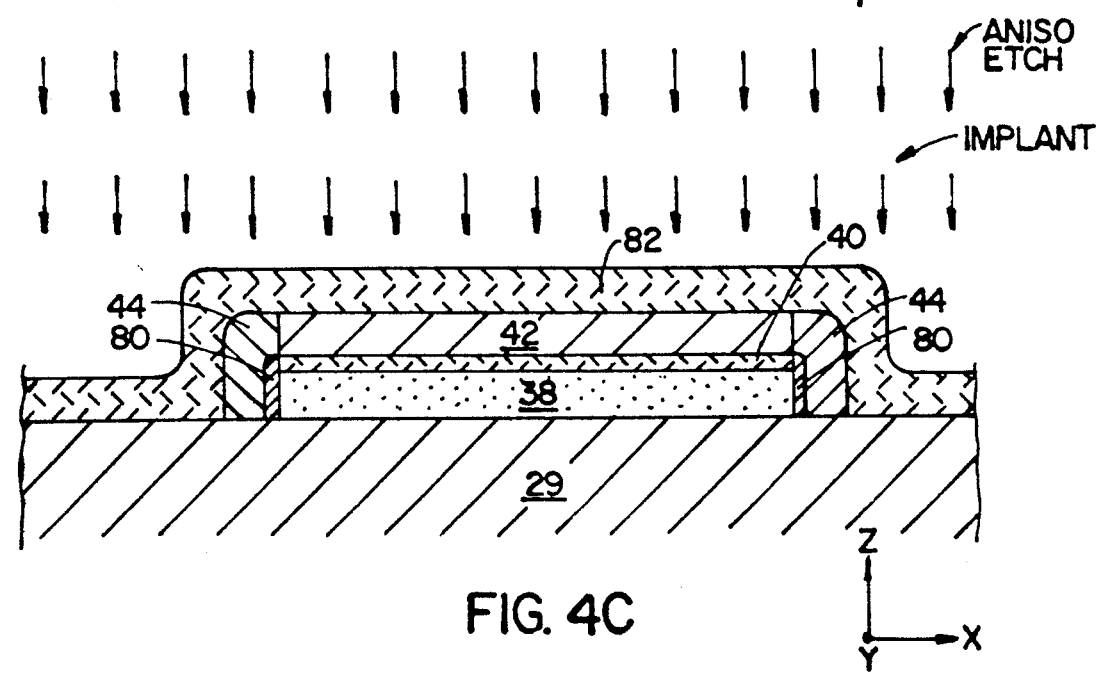
Figure 4D:
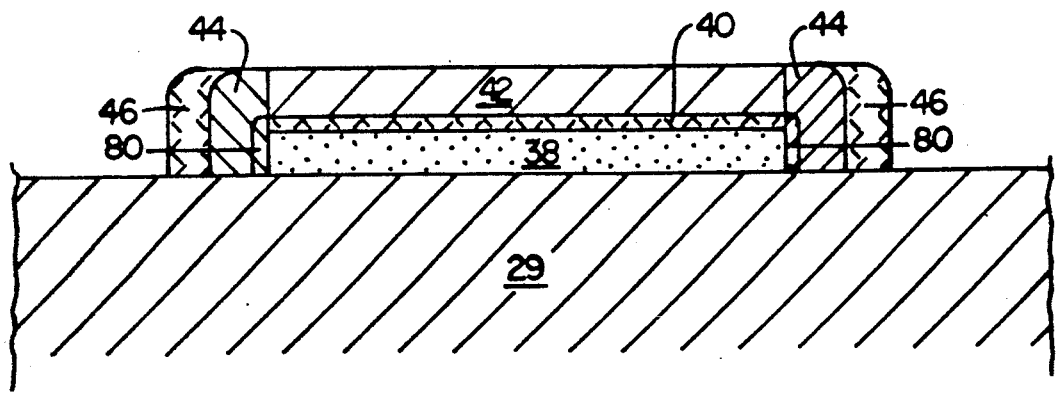
Figure 5A:
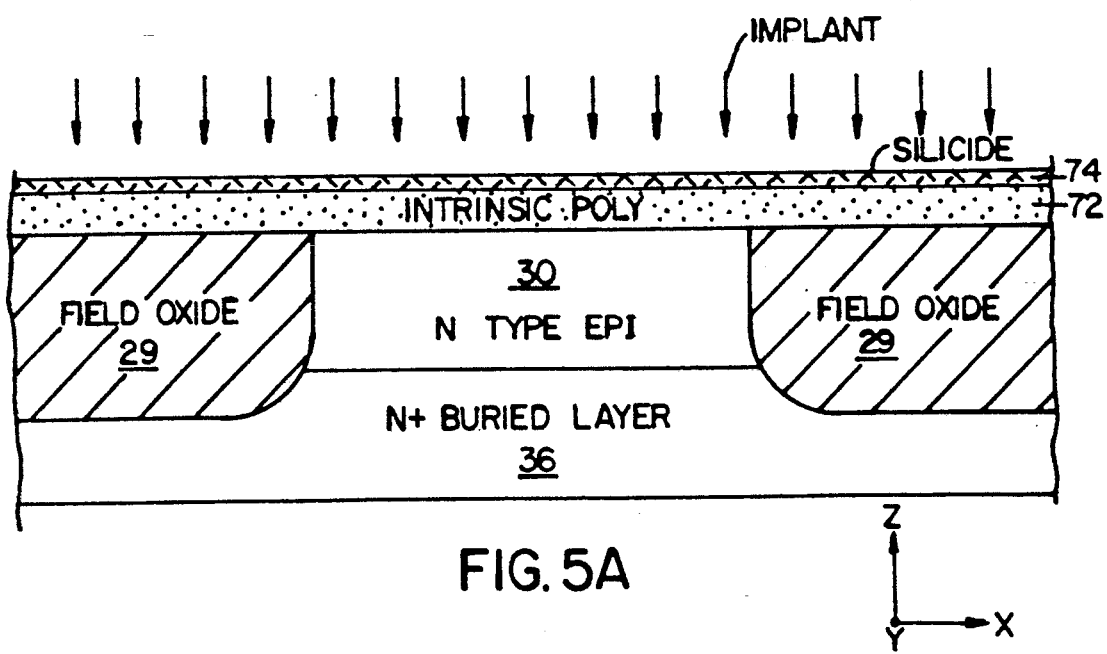
FIGS. 5A-5E are cross-sectional views of the transistor taken along section line 5—5' in FIG. 2 through the isolation island of the transistor at various stages in the process.
Figure 5D:
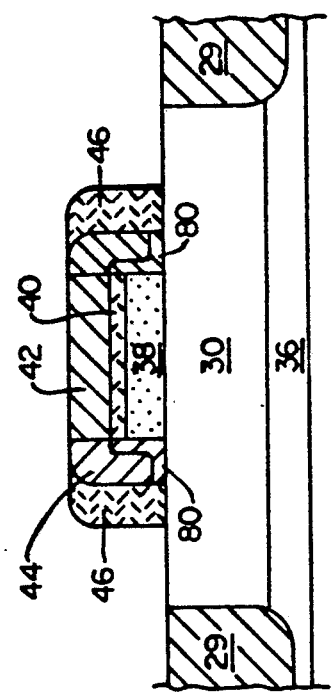
Figure 5E:
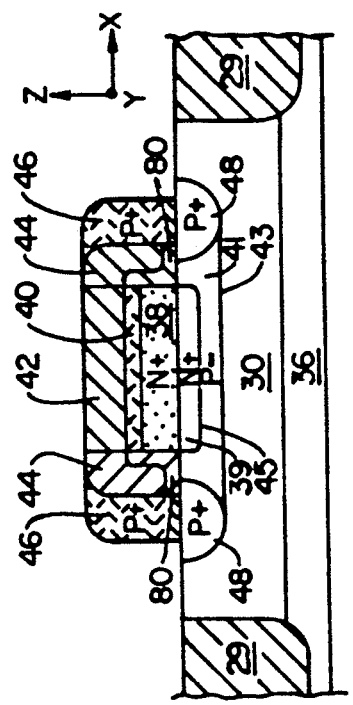
Figure 5B:
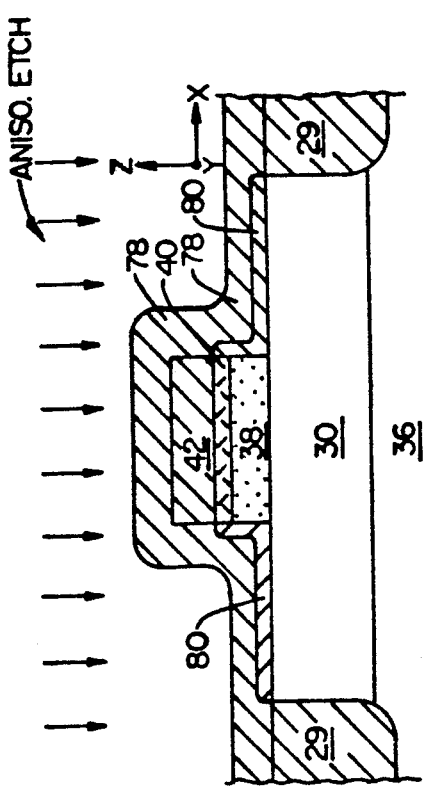
Figure 5C:
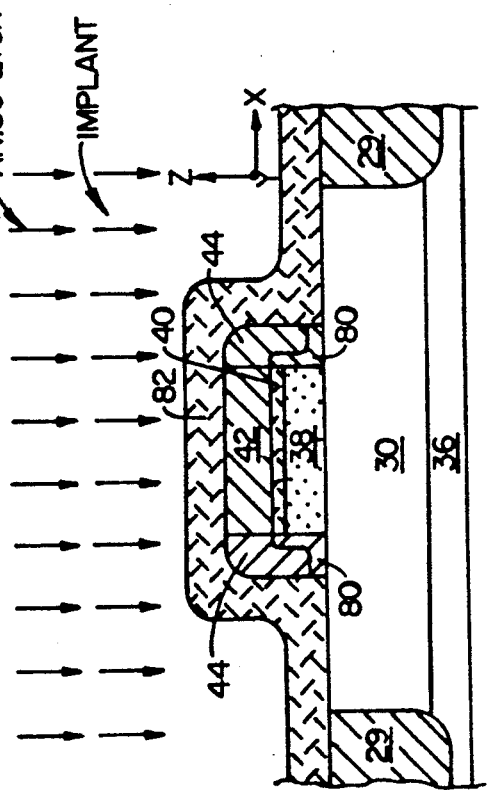
Figure 6A:
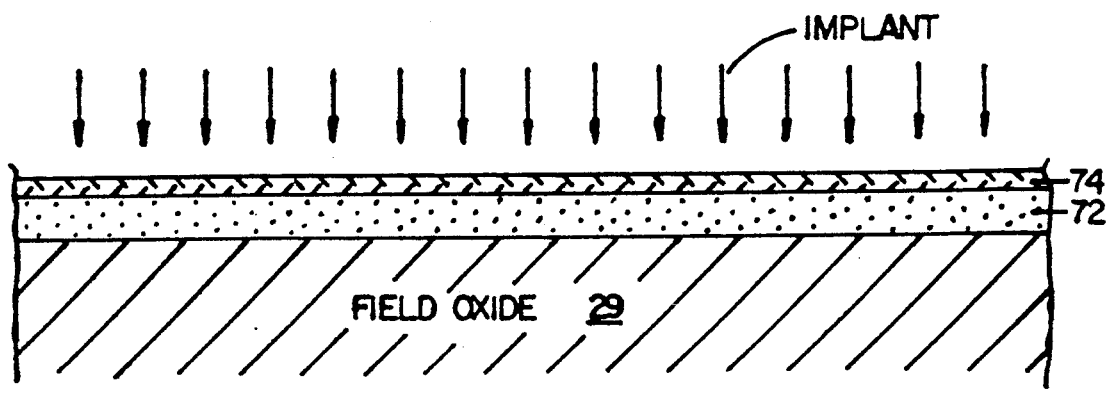
FIGS. 6A-6E are cross-sectional views of the transistor taken along section line 6—6' in FIG. 2 through the base contact pad.
Figure 6B:
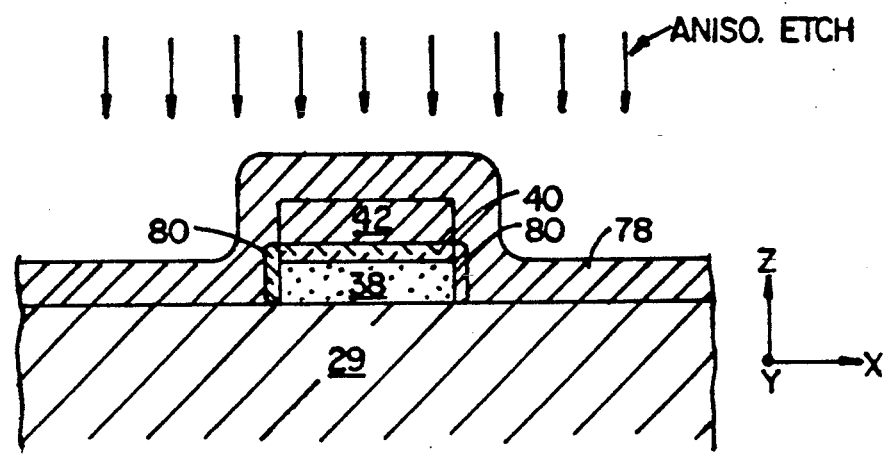
Figure 6C:
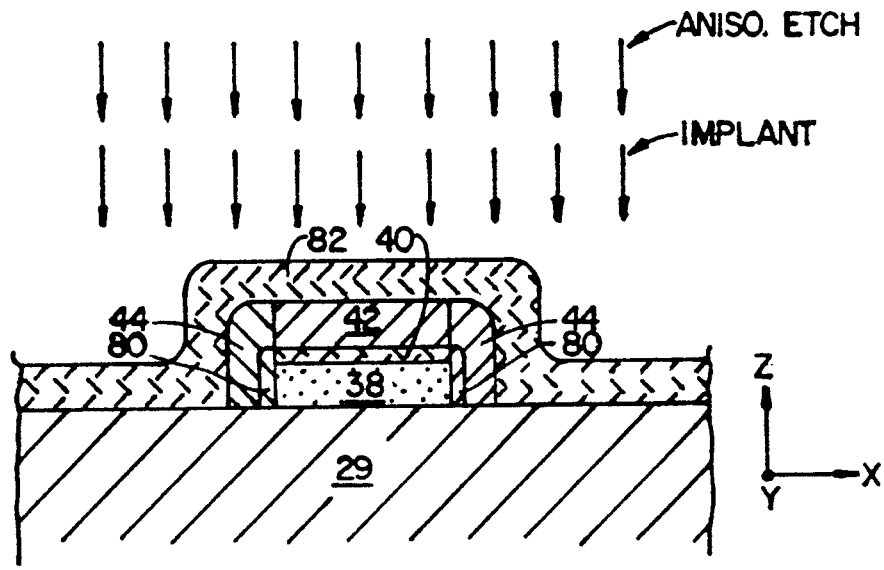
Figure 7A:
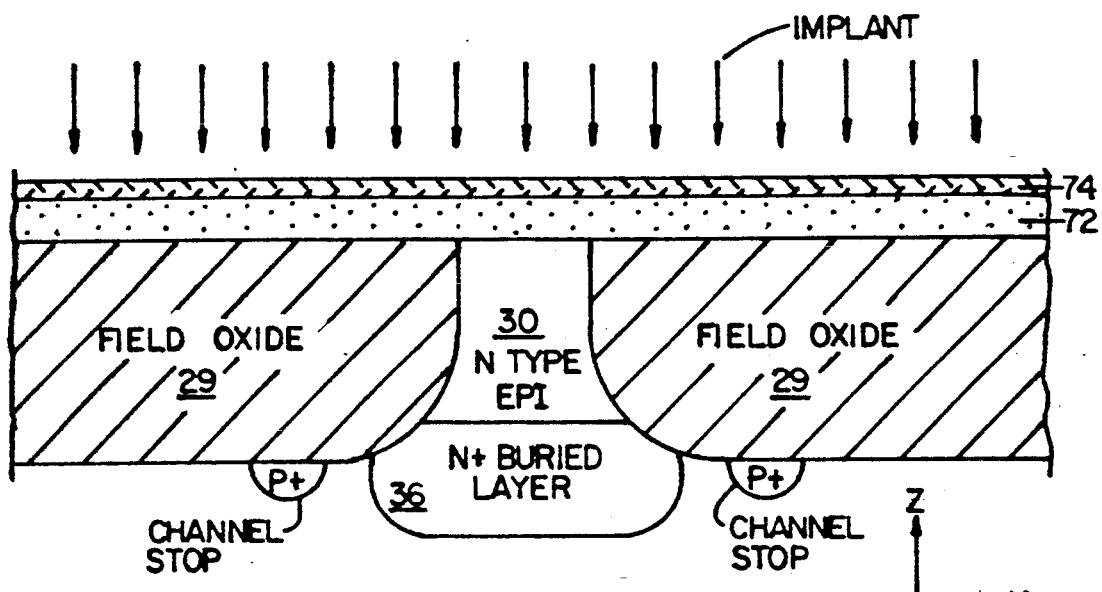
FIGS. 7A-7E are cross-sectional views of the transistor of the invention taken along section line 7—7' in FIG. 2, which runs through the long dimension of the emitter contact stripe, the base contact pad and the emitter contact pad.
Figure 7B:
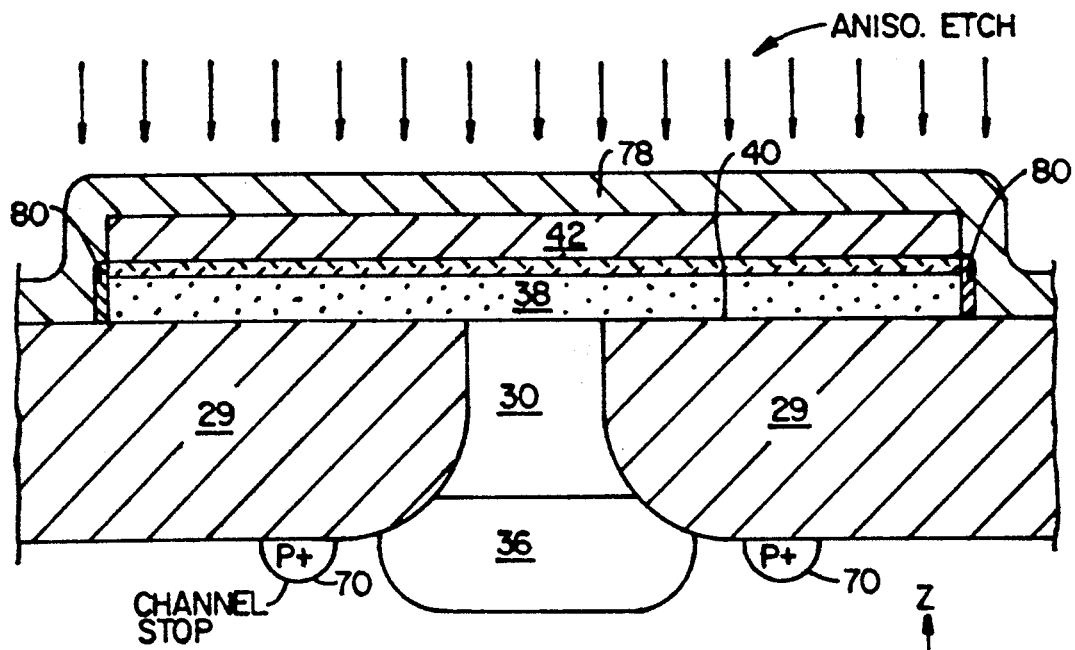

There follows a description of a preferred process for making the structure of FIGS. 1 and 2. The process will be described with the aid of a series of sectional drawings taken as a time sequence through various sections in the final structure shown in FIG. 2. A series of sectional views labeled FIG. 4A, 4B . . . will detail the structure at the section line 4—4' in FIG. 2 through the emitter contact a various stages in the process. A series of sectional views labeled FIG. 5A, 5B . . . will detail the structure at the section line 5—5' in FIG. 2 through the isolation island at various stages in the process. FIG. 1 shows the final structure minus the final layer of insulating material for passivation. A series of sections labeled FIG. 6A, 6B . . . will detail the structure at the section line 6—6' in FIG. 2 through the base contact at various stages in the process. A series of sections labeled FIG. 7A, 7B . . . will detail the structure at the section line 7—7' in FIG. 2 longitudinally through the emitter contact stripe along the y axis at various stages in the process.

Fabrication of the transistor starts with the conventional growth of a layer of epitaxial silicon 30 followed by the conventional formation of an isolated regions or isolation island of epitaxial silicon surrounded on all sides by field oxide 29 which extend completely through the epitaxial layer 30. Any of the many ways of forming isolated regions of epi will suffice, but the Fairchild Isoplanar TM method is preferred. This method is well known in the industry, and needs no further discussion here. It is also preferred to form P+ channel stop implants such as those shown at 70 in FIG. 5A under the field oxide and completely surrounding the isolation island 30. The purpose of these channel stop implants, as is well known, is to prevent the formation of conductive channels in parasitic MOS transistors under the field oxide, thereby preventing true electrical isolation of the island 30 from other nearby islands. Such channel stops are not critical to the invention and may be omitted if these parasitic MOS transistors are not formed or otherwise are not a problem. The channel stops 70 will not be shown on subsequent drawings for simplicity.

FIGS. 4A through 7A show the transistor structure at an early stage in the processing after the isolation island 30 has been formed and a layer of intrinsic poly has been deposited after a layer of silicide 74 has been formed on top of the poly and during an implant of impurities into the silicide. After formation of the isolation island, a layer 72 of undoped polysilicon 72 is deposited as shown in FIGS. 4A through 7A. Deposition of the layer of poly 72 is by any known method such as chemical vapor deposition.

After the poly layer 72 is deposited, a layer of silicide 74 is formed over the poly layer 72. The silicide layer 74 may be formed in any conventional manner. Two known ways of forming silicide are, first, by depositing the silicide directly using a reaction chamber; and second, by depositing a layer of refractory metal over a layer of the polysilicon and then heat treating the metal layer with a short heat pulse to cause the polysilicon and metal to react and form a silicide. The manner in which the silicide layer 74 is formed is not critical to the invention.

Following formation of the silicide layer 74, an implant step or steps is performed. The purpose of this implant is to dope the silicide layer 74 with both P type and N type impurities. These impurities will later be driven out of the silicide by a heat step and will diffuse into the poly layer 72 to dope it N+ and into the epi 30 under the poly emitter contact stripe 38 to form the N+ emitter region 39 and the P— base regions 41 in FIG. 1. During the implant shown in FIGS. 4A-7A, the silicide 74 is doped N+ to a concentration of approximately $10^{20}$ atoms per cubic centimeter and is also doped P— to a concentration of approximately $10^{18}$ atoms per cubic centimeter. Accordingly, the energy level of the implant of these two impurities and the dosage level should be such that the silicide layer 74 reaches the above concentration levels.

Following the implant of the silicide layer, a layer of CVD oxide (not shown in FIGS. 4A through 7A), which is approximately 5000 Å thick, is deposited over the entire wafer. This CVD oxide will be etched along with the silicide layer 74 and the poly layer 72 to form the oxide layer 42 in FIG. 1. Other compatible insulating materials may be substituted for the CVD oxide layer 42 in some embodiments. After this CVD oxide layer is deposited, photoresist is deposited, exposed to a radiation source through a mask and developed to form an etch mask in the shape shown in FIG. 8. The outline of this etch mask is shown at 76 in FIG. 8. Once the etch mask is formed, the poly layer 72, the silicide layer 74, and the CVD oxide layer are etched, preferably by an anisotropic plasma etch, to form the emitter contact stripe and the emitter contact pad 31. The emitter contact stripe is comprised of the poly stripe 38 in FIG. 1 with the self-aligned silicide layer 40 formed thereover and the self-aligned CVD oxide layer 42 formed over the silicide layer. The silicide layer 40 and CVD oxide layer 42 are both self-aligned with their edges coincident with the edges of the poly 38 because of this single etch step, i.e., all three layers are etched simultaneously using the same etch mask.

In some embodiments where it is desired to make an emitter contact stripe which is more narrow along the x axis than the minimum dimension D, an isotropic etch with a controlled lateral etch can be used for the etch step symbolized by FIG. 8. In such embodiments, the width of the etch mask 76 in the x axis over the isolation island is set at one D. After the photoresist is developed, an isotropic wet etch or an isotropic plasma etch is used to define the emitter contact stripe. The etch should have a known, well-controlled etch rate in the x and y directions relative to its etch rate in the z direction. If this is the case, the final width of the emitter contact stripe in the x direction for a given thickness of the poly 38, the silicide 40 and the CVD oxide 78 can be accurately predicted if the thickness of the combined poly/silicide oxide emitter contact stripe is known and the etch time is known. In such embodiments, emitter widths of 0.6 microns may be achieved. Of course the masked area defining the emitter contact pad 31 should be adjusted in such embodiments to leave an adequately sized pad 31 after the overetching occurs.

In alternative embodiments where the silicide layer 40 is not used, the steps to this point in the process are identical except that the impurity ions are implanted into the poly layer 72 instead of into the silicide layer 74.

The next steps in the process are for the purpose of forming the insulating spacer 44 around the emitter contact stripe. Referring to FIGS. 4B through 7B the structure of the invention is shown during the anisotropic etch which forms the spacer 44. One or more intermediate steps precede this anisotropic etch step.

Because the spacer 44 insulates the emitter contact stripe from the base contact stringer, it is important that the electrical integrity of this insulating spacer 44 be as high as possible. Although in some embodiments a layer of CVD oxide 78 may be used alone, in the preferred embodiment, a layer of thermal oxide 80 is grown over the exposed surfaces of the silicide layer 40 and the poly layer 38 and any exposed epi in the isolation island 30 before the CVD oxide layer 78 is deposited. CVD oxide is known to have more pinhole type defects in it than does thermally grown silicon dioxide (hereafter thermal oxide). By first growing a layer of thermal oxide 80 over all exposed edges of the emitter contact stripe which can be oxidized and then depositing the CVD oxide, the electrical integrity of the spacer 44 can be improved. However, the use of the thermal oxide layer 80 is not absolutely essential, and it can be eliminated in some embodiments. Indeed, the use of oxide as the insulating spacer 44 is not essential, and other compatible insulators may be used in some embodiments. In fact, although preferred, the use of oxide as the insulation spacer 44 is not essential. Other insulating materials which are thermally, electrically, and mechanically compatible with the polysilicide/CVD oxide sandwich making up the emitter contact stripe will also work. The thickness of the CVD oxide layer 78 should be the desired thickness of the spacer 44.

After the thermal oxide 80 and CVD oxide 78 are formed, the spacer 44 is formed by an anisotropic etch step symbolized by the arrows in FIGS. 4B through 7B. This anisotropic etch step is generally a plasma etch, and the type of etchant ions and etching conditions to achieve anisotropy are well known to those skilled in the art. The desired end result is that all the CVD and thermal oxide from the layers 78 and 80 respectively lying in the x-y plane is etched off leaving intact only the CVD and thermal oxide from the layers 78 and 80 lying in the x-z and y-z planes. The etch time must be set such that this end result is achieved. If the etch time is longer than the time needed to remove the CVD oxide and thermal oxide in the x-y plane, some of the oxide in the layer 42 will be removed. This will not be harmful as long as an excessive amount is not removed.

FIG. 9 shows the emitter contact stripe after the spacer 44 has been formed. Note how the spacer 44 extends all the way around the emitter contact stripe. The height of the spacer 44 in the z direction will be even with the top surface of the CVD oxide layer 42, i.e., the surface in the x-y plane of the CVD oxide 42 farthest from the surface 43 of the isolation island in FIG. 1. The width of the spacer 44 in the x and y directions is approximately 3000 Å in the preferred embodiment.

FIGS. 4C–7C illustrate the stage in the processing in the various sections in the device after the insulating spacers 44 have been formed and during the step of implantation of a layer of silicide which has been deposited over the entire wafer. The layer of silicide 82 may be formed in any conventional manner which allow formation of silicide over oxide. Preferably, it is formed by directly depositing the silicide in a reaction chamber in a process which is well known in the art. The process used to deposit the silicide must be one where silicide can be successfully formed over oxide since it is imperative that the oxide spacers 44 be completely covered with silicide. This is necessary so that the stringers 46 of the base contact can be formed.

Since the silicide layer 82 is to become the base contact, it must be doped P+ for an NPN transistor. The silicide layer 82 is very similar to polysilicon in that it can be doped with impurities and is conductive. Accordingly, the silicide layer 82 is implanted with P type impurities as shown in FIGS. 4C through 7C. The implant energy and dosage should be such that the resultant silicide is P type in conductivity and has a concentration of approximately $10^{20}$ atoms/cm$^3$.

The next step is to form the silicide base contact stringers 46 by means of an anisotropic etch. This anisotropic etch is symbolized by the second set of arrows in the z direction in FIGS. 4C through 7C. The particular manner in which this anisotropic etch is accomplished is well known to those skilled in the art. The purpose of this etch is to remove all the silicide of the layer 82 which is in the x-y plane while leaving the silicide which is in the z-y plane. Accordingly, an etchant and etch conditions should be used such that the etch is preferential along the z direction while very little etching occurs in the y and x directions. The etch time must be such that all the silicide of the layer 82 which lies in the x-y plane is removed and the top of the oxide layer 42 is reached. However before this anisotropic etch is performed, a base contact pad etch protect mask must be formed over the silicide layer 82 at the location where the base contact pad is to be formed. The location of the base contact pad is shown at 33 in FIG. 2.

Figure 7C:
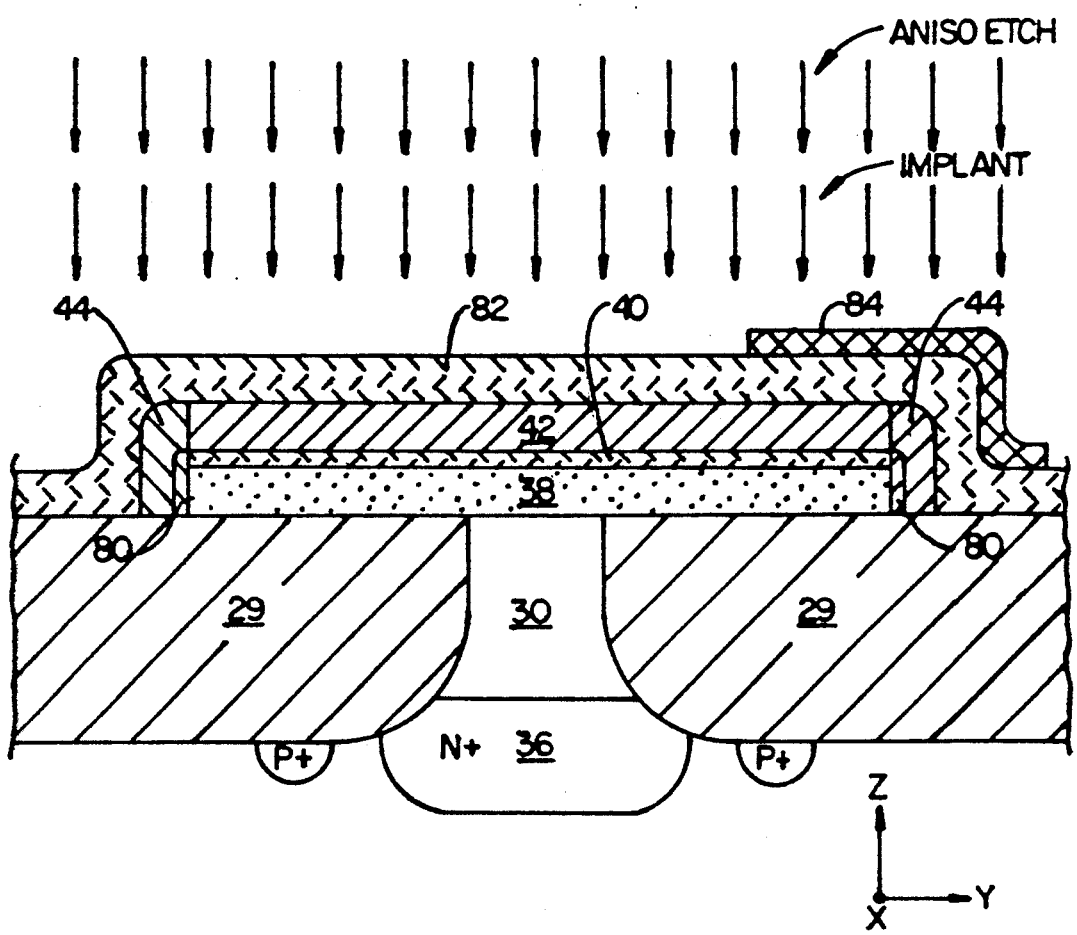
Figure 7D:
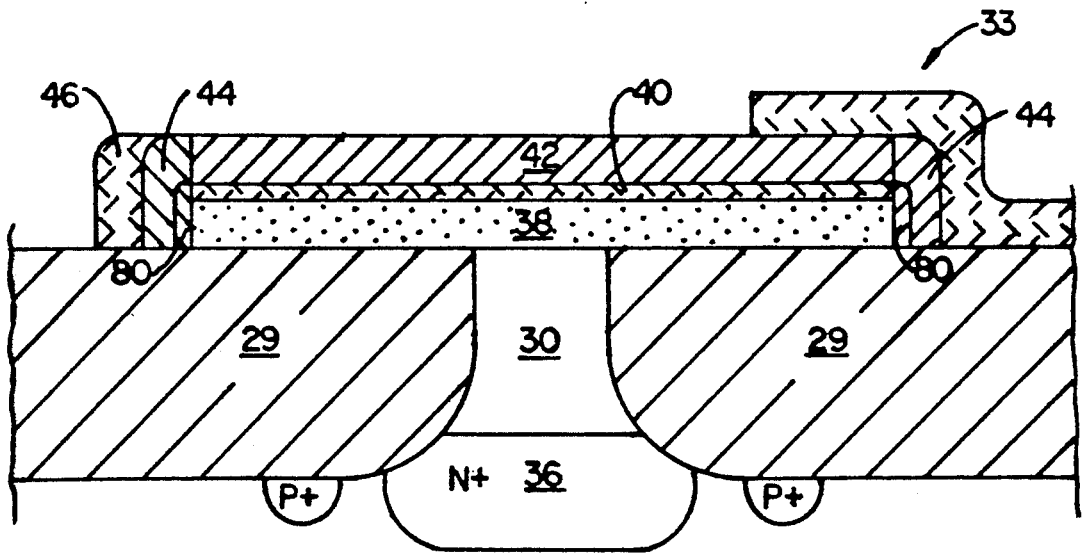

Referring to FIG. 7C, there is shown the relative location of the base contact pad etch protect mask 84. The purpose of this mask 84 is to protect the doped silicide layer 82 during the anisotropic etch step such that the silicide of the layer 82 lying underneath the mask 84 is not etched away during the anisotropic etch step to form the base contact stringers 46. Accordingly, this mask 84 must be formed after the P type implant step used to dope the silicide layer 82 to P+ conductivity and before the anisotropic etch step used to form the base contact stringers 46.

The mask 84 is formed in conventional manner using photoresist. It should have the shape of the base contact pad 33 in FIG. 2, and it should shadow a sufficient area of the silicide layer 82 that a contact window or post type via such as the window 68 in FIG. 2 can be easily formed therein taking into account the alignment tolerances which can be consistently met in the fabrication facility where the devices are fabricated.

Figure 10:
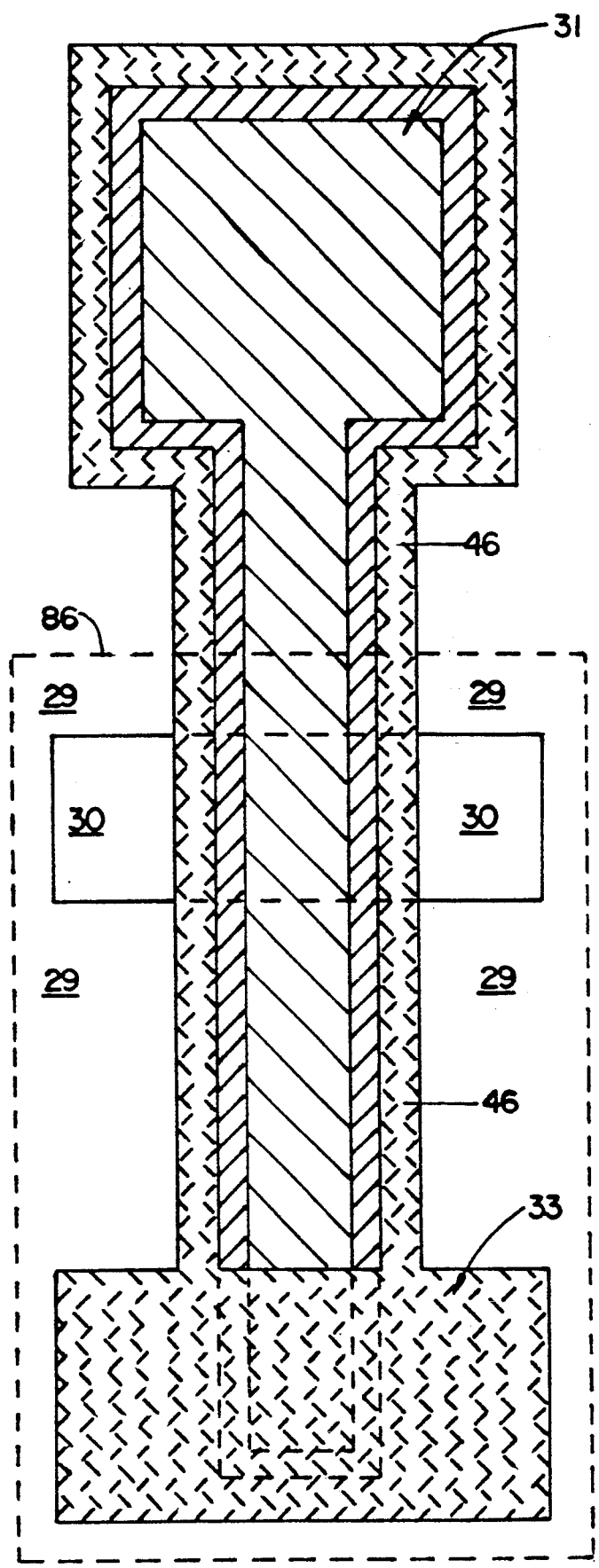
FIG. 10 is a plan view of the structure after the base contact stringer has been formed.

FIGS. 4D through 7D show the state of the device after the anisotropic etch step to form the base contact stringers 46. Note that FIG. 6D shows that the base contact pad 33 is formed over the emitter contact stripe 38 and is completely insulated therefrom by the oxide layer 42 and the oxide spacers 44 including the thermal oxide layer 80 in the preferred embodiment. FIG. 10 shows the resultant structure in plan view after the anisotropic etch step to form the base contact stringers 46 and after the base contact pad etch protect mask 84 is removed. Note in FIG. 10 that the base contact stringer 46 extends completely around the emitter contact stripe 38.

As noted above, the base contact stringer 46 is preferably removed from around the emitter contact pad 31. To accomplish this stringer removal, a stringer removal etch mask 86 having the outline shown in phantom in FIG. 10 is formed over each transistor on the wafer. This stringer removal mask is formed by developing photoresist in the pattern shown in phantom so as to leave a protective layer of cross linked photoresist covering all the structure within the phantom line 86 in FIG. 10. The structure is then exposed to a selective etch which attacks silicide but which does not attack oxide. Such etches are well known. This selective etch removes all the exposed stringer 46 which is not covered by the etch mask 86. This leaves the structure as shown in FIG. 2 with the base contact stringers 46 extending around the base contact pad 33, across the isolation island 30 and along the emitter contact stripe part of the way toward the emitter contact pad 31. However, the base contact stringers 46 stop at the perimeter of the etch protect mask 86 in FIG. 10. As noted earlier, removal of the stringer 46 is not necessary to make an operative transistor. However, such removal does make it easier to fabricate a multiple transistor structure with shared emitters such as that shown in FIG. 3.

After removal of the stringers 46 from around the emitter contact pad 31, it is necessary to perform a heat step to drive the impurities in the silicide layer 40 out of the silicide and into the emitter contact stripe poly 38 and into the epitaxially grown silicon 30 to form the emitter region (39 in FIG. 1) and the base region (41 in FIG. 1). During this heat step, impurities are also driven out of the P+ doped base contact stringers and into the epi 30 to form better base contacts.

Figure 4E:
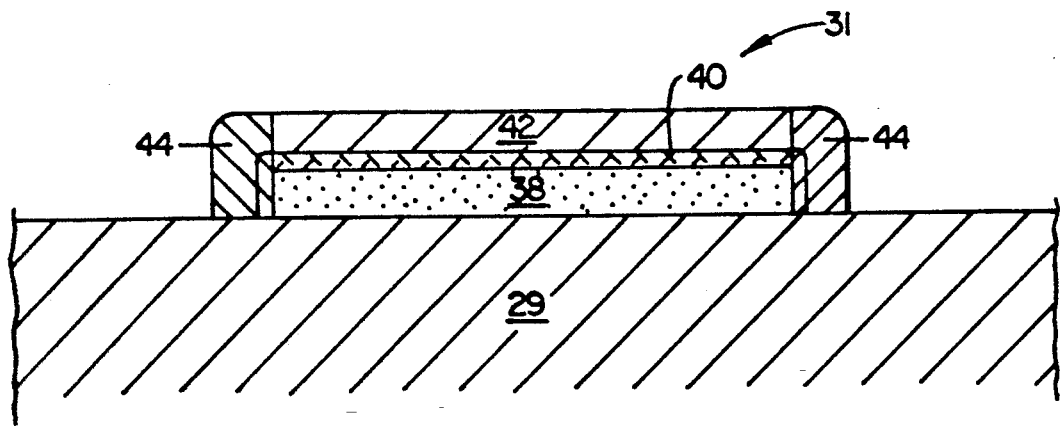

FIGS. 4E through 7E indicate the final configuration of the base and emitter contact structure for the transistor of the invention after the heat drive in step but before the final passivation layer is formed and before any contact windows or post type vias are formed. With particular reference to FIG. 4E, it will be noted that the base contact stringers 46 are absent from the positions around the perimeter of the emitter contact pad 31. With particular reference to FIG. 5E, the effects of the heat step can be observed. In the preferred embodiment, the heat step is performed in an oven heated to a temperature of 900° C. for ½ hour. As noted earlier, the silicide layer 40 had been doped N+ with arsenic and P− with boron when this silicide layer 40 was first formed. Similarly, the base contact stringers 46 were doped P+ with boron when the layer of silicide from which they were formed was first deposited. During the heat step, the N and P type impurities from the silicide layer 40 diffuse downward into the polysilicon of the emitter contact stripe 38 and into the epitaxial silicon 30 in the isolation island. The P type impurities also diffuse downward, and, since these P type impurities move faster than the N type impurities under the same diffusion conditions, they overtake the N type impurities. When the P type impurities outrun the N type impurities as they diffuse through the emitter contact stripe poly 38 and the epitaxial silicon 30 in the isolation island, they form the emitter and base regions. The final result is an emitter region 39 which is formed to a shallow depth in the epitaxial silicon 30 and a narrow base region 41 which has a base width in the z direction which is equal to the difference in diffusion speeds times the duration of the diffusion. The diffusion time should therefore be adjusted such that the desired base width is obtained. Further the diffusion time should be long enough that the N type impurities have time enough to reach and make a shallow penetration of the epitaxial silicon 30. If the N type impurities have time to reach and penetrate the epi layer 30, then the P type impurities will also reach and penetrate the epi 30 some small distance further than the N type impurities penetrated.

Figure 11:
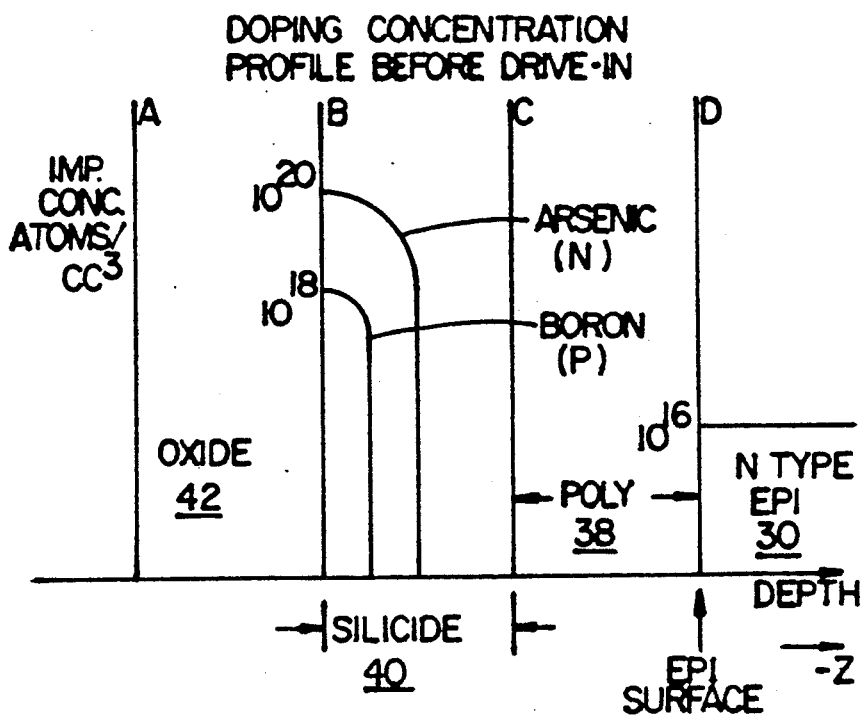
FIG. 11 is a doping profile of the base-emitter structure before the drive-in step.

FIG. 11 illustrates the impurity concentration profile in atoms/$cc^3$ plotted versus depth in the structure before the drive-in step. Depth line represents the top (most positive z) of the oxide layer 42. No impurities are present in the oxide layer 42. Depth line B represents the depth of the interface between the oxide layer 42 and the silicide layer 40. The boron and arsenic doping concentration curves in the silicide region between depth lines B and C represent the effects of the separate P type and N type implants in the silicide layer 40 after the layer was formed and before the emitter contact stripe was formed. Of course this doping may be accomplished in other ways, and any way which is capable of doping the silicide layer 40 to N+ concentration ($10^{20}$) and P− ($10^{18}$) will suffice for purposes of practicing the invention. The depth line C represents the interface between the silicide layer 40 and the poly 38 of the emitter contact stripe. The poly 38 extends between the depth lines C and D. No impurities are present in the poly before the drive-in. The depth line D indicates the surface of the epi region 30 which is doped N− at the $10^{16}$ level.

Figure 12:
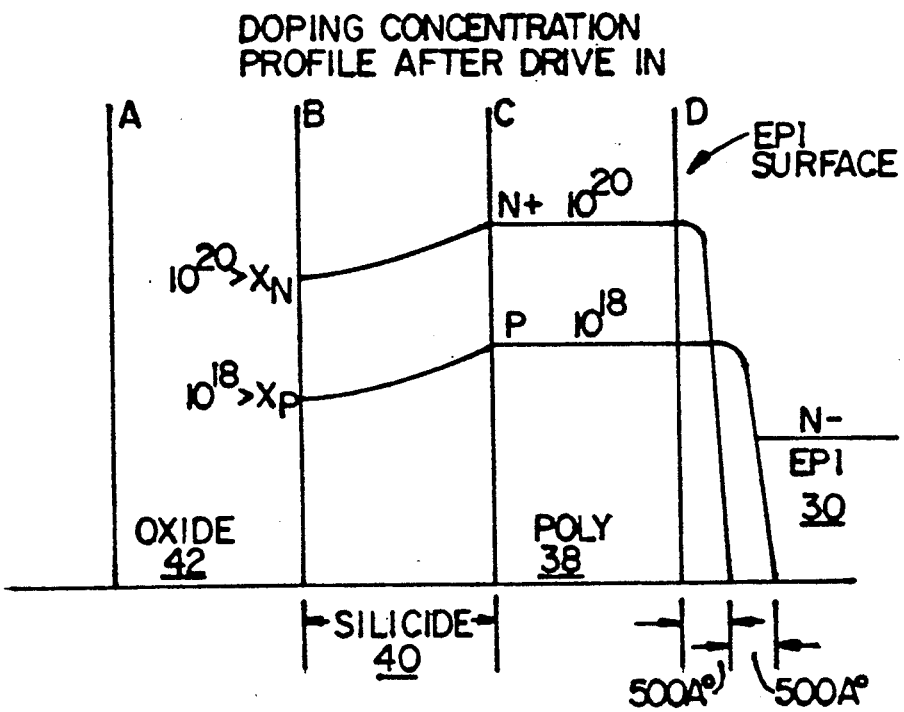
FIG. 12 is a doping profile after the drive-in step.

FIG. 12 is the doping profile after the drive-in. The doping concentration in the silicide 40 after the drive-in is somewhere less than $10^{20}$ N type and somewhere less than $10^{18}$ P type. The doping level in the poly 38 is $10^{20}$ N type and $10^{18}$ P type. Starting at the surface of the epi layer 30, depth line D, the doping concentration is N type for a penetration of about 500 Å to form the emitter region 39, and then changes to P− type for about 500 Å to form the base region 41. The doping reverts to N− at about 1000 Å from the surface. The base-emitter junction is thus about 500 Å deep, and the base-collector junction is about 1000 Å from the surface.

Referring again to FIG. 5E, the drive-in step also causes P+ base contact regions 48 to be formed underneath the base contact stringers 46 in the epitaxial silicon 30. These regions 48 are caused by the out diffusion of the P type impurities from the base contact stringers 46 into the epitaxial silicon 30. The diffusion time selected for the drive-in should be such that the P+ base contact regions 48 laterally diffuse far enough to join the outward diffusion in the positive and negative x directions of the P type impurities from the silicide layer 40. This provides a good contact structure for the base region of the transistor.

Figure 6D:
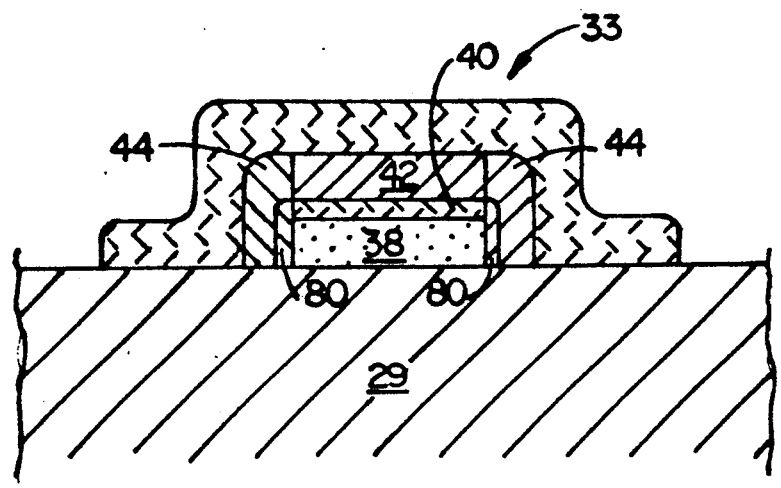
Figure 6E:
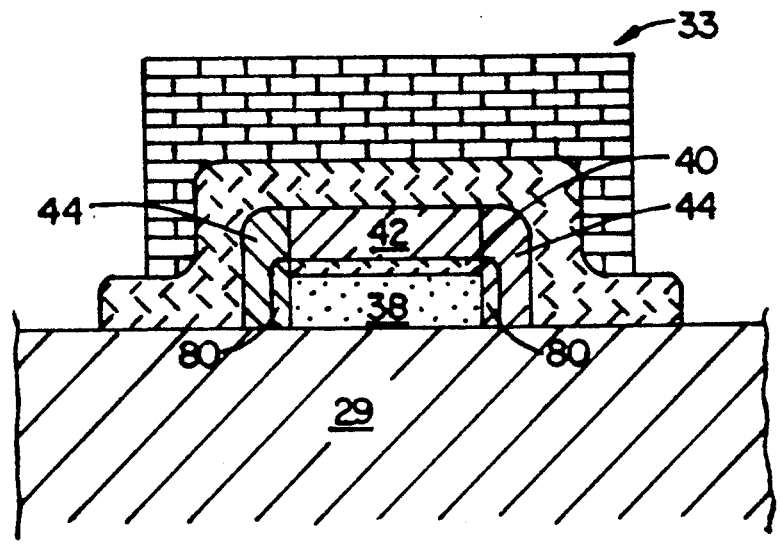

FIG. 6E is the same as the FIG. 6D in that the structure of the base contact pad 33 is unchanged by the heat step and unchanged by the selective silicide etch to remove the base contact stringer from around the emitter contact pad.

The final steps in completing the transistor structure are to deposit a layer of planarized insulating material over the entire structure and to etch contact holes or otherwise form post type vias to make contact with any base or emitter contact pads which are to be connected to an overlying metal layer. Alternatively, as shown in FIG. 3, the emitter contact poly stripe 38 can be extended over the field oxide to the position of another transistor and formed over the isolation island of that transistor so as to form a shared emitter contact.

Figure 7E:
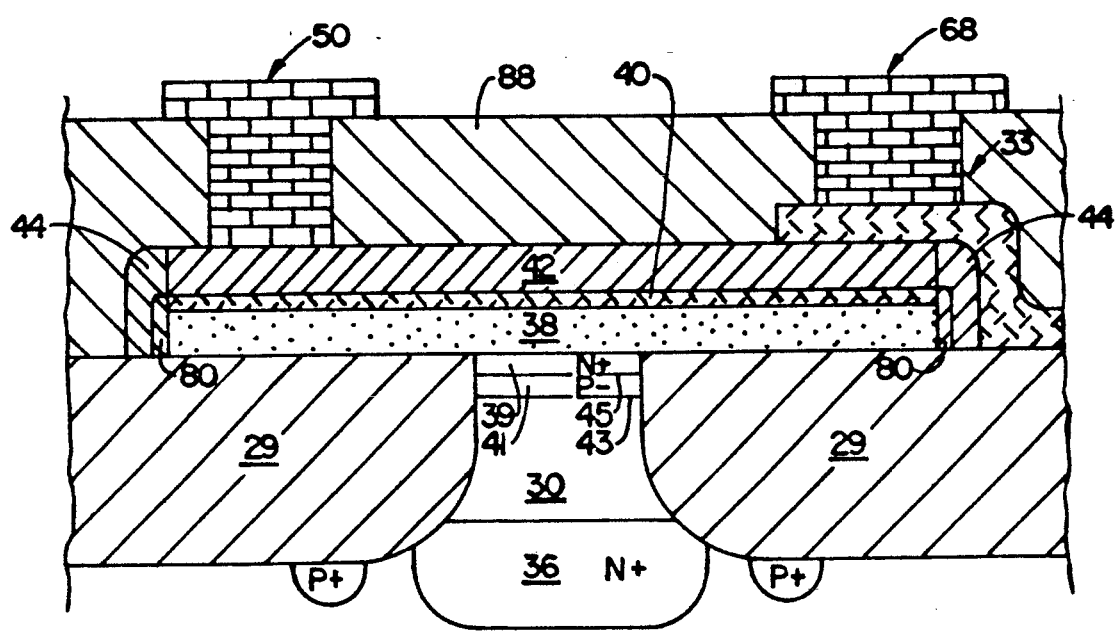

FIG. 7E shows a final view of the structure after the heat step, and includes the final passivation layer of insulating material 88 through which contact holes or post type vias such as those shown at 50 and 68 are formed. It will be noted that the base-emitter junction 45 and the base-collector junction 43 in FIG. 7E both terminate on the field oxide 29 thereby providing low junction leakage characteristics.

Figure 13:
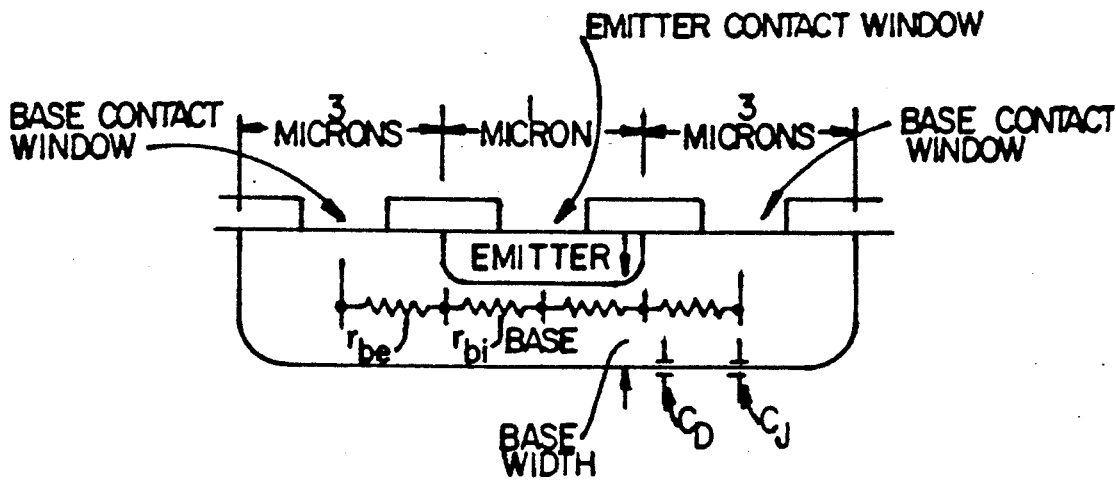
FIG. 13 is a cross-sectional view of a conventional base-emitter structure.

The advantages of the invention are manifest. To best illustrate them requires a comparison with a conventional base-emitter structure. A prior art base-emitter structure is shown in FIG. 13. In FIG. 13, the emitter junction is shown very conservatively at one micron in width. In reality, this would probably be unachievable since the minimum contact window dimension is generally one micron in today's process technology in most fabrication facilities. The base-collector junction is 3+1+3 microns or 7 microns wide. If the depth into the page of the isolation island is one micron, then the total area of the base-collector junction is 7 microns$^2$. There is associated with the base contact structure of the device of FIG. 13 a base resistance which is comprised of the resistance from the base contact window to the center of the base region under the center of the emitter region. Traditionally, this is divided into two components: $r_{be}$, or extrinsic base resistance comprising the resistance of the path through the lightly doped base epi from the center of the base contact to the edge of the base-emitter junction; and $r_{bi}$, or intrinsic base resistance comprising the resistance of the path through the base epi from the edge of the emitter to the center of the base region under the center of the emitter. Because of the light base doping and the thinness of the base region under the emitter region, the extrinsic base resistance is typically 1000 ohms and the intrinsic base resistance is typically 10,000 ohms in the structure of FIG. 13.

The high frequency cutoff and switching speed for bipolar transistors is generally proportional to the time constant of the RC circuit comprised of the base resistance and the junction capacitance of the collector-base junction. If the extrinsic and intrinsic base resistance goes up, the time constant gets greater, and the frequency response gets worse and the switching speed becomes greater in the sense that fewer transitions from the off state to the on state and back again can be made per unit of time. The same result occurs if the junction capacitance of the collector-base junction becomes greater which generally happens if the area of the collector-base junction becomes greater.

The factors that affect the base resistance are the base doping, the path length, and the base width. Shorter path lengths give less base resistance. The path lengths are related to the size of the junctions.

The collector-base junction capacitance is comprised of two components: the space charge or junction capacitance; and the transition or diffusion capacitance. The space charge capacitance is larger for larger junction areas. The diffusion capacitance increases with increasing current. The diffusion capacitance is thus a factor only when the transistor is in saturation and the collector-base junction is forward biased. Since current is equal to current density at the junction times the junction area, the diffusion capacitance will be less for a smaller junction. Smaller junction capacitance, like smaller base resistance leads to faster switching speeds and better frequency response.

Figure 14:
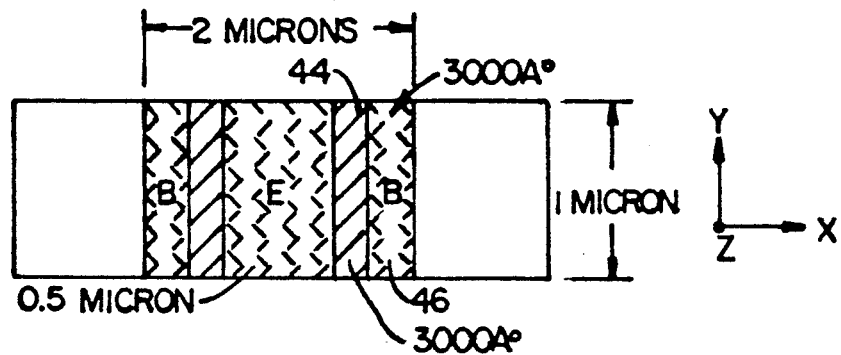

FIG. 14 illustrates the typical dimensions of the base-emitter contact structure of the invention. Note that the emitter is shown as 0.5 microns in width which is achievable if the overetching process step to define the emitter contact stripe is used or if a lithography or other type of process which is capable of achieving submicron line widths is used to manufacture the transistor. The total width of the active area in the x direction is only 2 microns. This narrow width for the active area exists because the insulating spacers 44 and the base contact stringers 46 can be made very narrow by virtue of the process with which they are made. In the preferred embodiment, the insulating spacer 44 and the base contact stringer 46 are only 3000 Å wide in the x direction. If the isolation island dimension in the y direction is only one micron, then the total active area and the total area of the base-collector junction is 2 micron$^2$. This yields a very low collector-base capacitance of 0.4 femptofarad. The emitter-base junction is only 0.5 microns$^2$ which yields a typical base-emitter junction capacitance of 0.3 femptofarad. In contrast with the junction areas of the conventional structure of FIG. 13, it will be appreciated by those skilled in the art that the invention enjoys a considerable advantage in terms of chip are consumed by each transistor active area and a considerable advantage in switching speed and frequency response.

Although the invention has been described in terms of the preferred embodiment, those skilled in the art will appreciate that numerous modifications to the structure or process are possible without departing from the true spirit and scope of the invention. All such modifications are intended to be included within the scope of the claims appended hereto.

What is claimed is:

1. A process for making a base and emitter contact structure for a transistor comprising the steps of:

forming an isolated island of monocrystalline silicon;

forming a layer of polysilicon covered by a first layer of metal disilicide;

doping the first metal disilicide layer with both P type and N type impurities where the impurities are selected such that the lower concentration impurity has a faster diffusion rate in terms of distance travelled per unit time for given diffusion conditions;

forming a layer of insulating material over said metal disilicide;

etching said combined three layers into the shape of an emitter contact stripe which crosses said island and which has an emitter contact pad located external to said island;

forming a second layer of insulating material over the etched structure;

anisotropically etching the second insulating layer until all the insulating material in planes parallel to the surface of said island is removed;

forming a layer of metal disilicide over the structure;

doping said second metal disilicide layer with impurities of the conductivity type which will exist in the base region of the final transistor;

masking a portion of said second metal disilicide layer which is to be the base contact pad at a location outside said island;

anisotropically etching away all portions of said second metal disilicide layer which lie in planes parallel to the surface of said island except that portion under said mask; and baking the resultant structure in an oven long enough and at a temperature sufficient to allow the impurities in said first metal disilicide layer to diffuse into said polysilicon and said monocrystalline silicon sufficiently to form an emitter region of the desired depth and a base region of the desired width which is in electrical contact with said stringers of said second metal disilicide layer.

2. The process of claim 1 wherein the step of doping the first metal disilicide layer includes doping said layer with impurities of two conductivity types where the impurity of the conductivity type that matches the conductivity of the base region to be formed later has a lower concentration than the concentration of the other impurity type.

3. The process of claim 2 where the two impurities are boron and arsenic.

4. The process of claim 2 wherein said doping step is by ion implantation.

5. The process of claim 1 wherein the step of forming said second insulating layer comprises the steps of thermally growing a layer of silicon dioxide followed by chemical vapor deposition of another layer of silicon dioxide.

6. The process of claim 5 wherein the chemical vapor deposition step continues until approximately 2000 to 5000 Å of oxide exist over the structure.

7. The process of claim 1 wherein the step of forming the second layer of metal disilicide is carried out such the second layer of metal disilicide forms over all parts of the structure and approximately 2000 to 5000 Å have been formed.

8. The process of claim 1 wherein the step of etching the combined three layers of polysilicon, metal disilicide and oxide comprises etching isotropically with a controlled lateral etch rate to form an etched image of the emitter contact stripe which is smaller in width than the etch mask image.

9. The process of claim 1 further comprising the step of selectively removing the stringer of metal disilicide from said second layer of metal disilicide from around said emitter contact pad.

10. A method of forming a contact structure having a first contact and a second contact separated by a common narrow sidewall, the method comprising:
   a) on a semiconductor body having a major surface, forming a first region of electrically conductive material disposed on and in contact with the semiconductor body, the first region having first sidewalls and forming the first contact;
   b) after forming said first region, forming a first layer, of first thickness electrically insulating material over the first region and on the first sidewalls and extending to the major surface to thereby define second sidewalls separated from the first sidewalls by the first thickness, said first layer formed by the steps of:
      i) depositing a layer of CVD oxide on said structure; and
      ii) anisotropically etching said oxide layer; and
   c) forming a second layer of second thickness electrically conductive material, disposed over at least the second sidewalls and extending to the major surface to thereby define third sidewalls separated from the second sidewalls by the second thickness, said second layer forming the second contact, said step of forming a second layer formed comprising the steps of:
      i) depositing a conductive material on said structure; and
      ii) anisotropically etching said conductive material to form said third sidewalls.

11. The method as recited in claim 10 wherein said second contact is a base contact, and further comprising the step of heating said structure to drive impurities from said second layer into said semiconductor body.

12. The method as recited in claim 10 further comprising the step of forming a layer of thermal oxide between said first region and said first layer.

13. The method as recited in claim 10 wherein said step of forming a second layer is a step of forming metal silicide.

14. The method as recited in claim 10 wherein said first region is used as an emitter contact.

* * * * *